(12) United States Patent
Bomberger et al.

(10) Patent No.: US 11,735,630 B2
(45) Date of Patent: Aug. 22, 2023

(54) INTEGRATED CIRCUIT STRUCTURES WITH SOURCE OR DRAIN DOPANT DIFFUSION BLOCKING LAYERS

(71) Applicant: Intel Corporation, Santa Clara, CA (US)

(72) Inventors: Cory Bomberger, Portland, OR (US); Anand Murthy, Portland, OR (US); Anupama Bowonder, Portland, OR (US); Aaron Budrevich, Portland, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 1061 days.

(21) Appl. No.: 16/238,858

(22) Filed: Jan. 3, 2019

(65) Prior Publication Data
US 2020/0219975 A1 Jul. 9, 2020

(51) Int. Cl.
H01L 29/78 (2006.01)
H01L 29/08 (2006.01)
H01L 29/161 (2006.01)
H01L 29/167 (2006.01)
H01L 29/66 (2006.01)
H01L 21/02 (2006.01)

(52) U.S. Cl.
CPC .... *H01L 29/0847* (2013.01); *H01L 21/02532* (2013.01); *H01L 21/02579* (2013.01); *H01L 29/161* (2013.01); *H01L 29/167* (2013.01); *H01L 29/66636* (2013.01); *H01L 29/66795* (2013.01); *H01L 29/7851* (2013.01)

(58) Field of Classification Search
None
See application file for complete search history.

(56) References Cited

U.S. PATENT DOCUMENTS

| | | | |
|---|---|---|---|
| 9,431,536 B1 * | 8/2016 | Wu | H01L 21/3065 |
| 9,870,926 B1 * | 1/2018 | Huang | H01L 29/66795 |
| 2012/0181625 A1 * | 7/2012 | Kwok | H01L 29/66628 |
| | | | 257/E21.409 |
| 2019/0221655 A1 * | 7/2019 | Chen | H01L 29/66636 |
| 2019/0393347 A1 * | 12/2019 | Kim | H01L 29/66545 |
| 2020/0006545 A1 * | 1/2020 | Liu | H01L 29/7848 |

* cited by examiner

*Primary Examiner* — Ali Naraghi
(74) *Attorney, Agent, or Firm* — Schwabe, Williamson & Wyatt, P.C.

(57) ABSTRACT

Embodiments of the disclosure include integrated circuit structures having source or drain dopant diffusion blocking layers. In an example, an integrated circuit structure includes a fin including silicon. A gate structure is over a channel region of the fin, the gate structure having a first side opposite a second side. A first source or drain structure is at the first side of the gate structure. A second source or drain structure is at the second side of the gate structure. The first and second source or drain structures include a first semiconductor layer and a second semiconductor layer. The first semiconductor layer is in contact with the channel region of the fin, and the second semiconductor layer is on the first semiconductor layer. The first semiconductor layer has a greater concentration of germanium than the second semiconductor layer, and the second semiconductor layer includes boron dopant impurity atoms.

20 Claims, 12 Drawing Sheets

INTEGRATED CIRCUIT STRUCTURES WITH SOURCE OR DRAIN DOPANT DIFFUSION BLOCKING LAYERS

TECHNICAL FIELD

Embodiments of the disclosure are in the field of advanced integrated circuit structure fabrication and, in particular, 10 nanometer node and smaller integrated circuit structure fabrication and the resulting structures.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Variability in conventional and currently known fabrication processes may limit the possibility to further extend them into the 10 nanometer node or sub-10 nanometer node range. Consequently, fabrication of the functional components needed for future technology nodes may require the introduction of new methodologies or the integration of new technologies in current fabrication processes or in place of current fabrication processes.

DESCRIPTION OF THE EMBODIMENTS

Figure 1A:
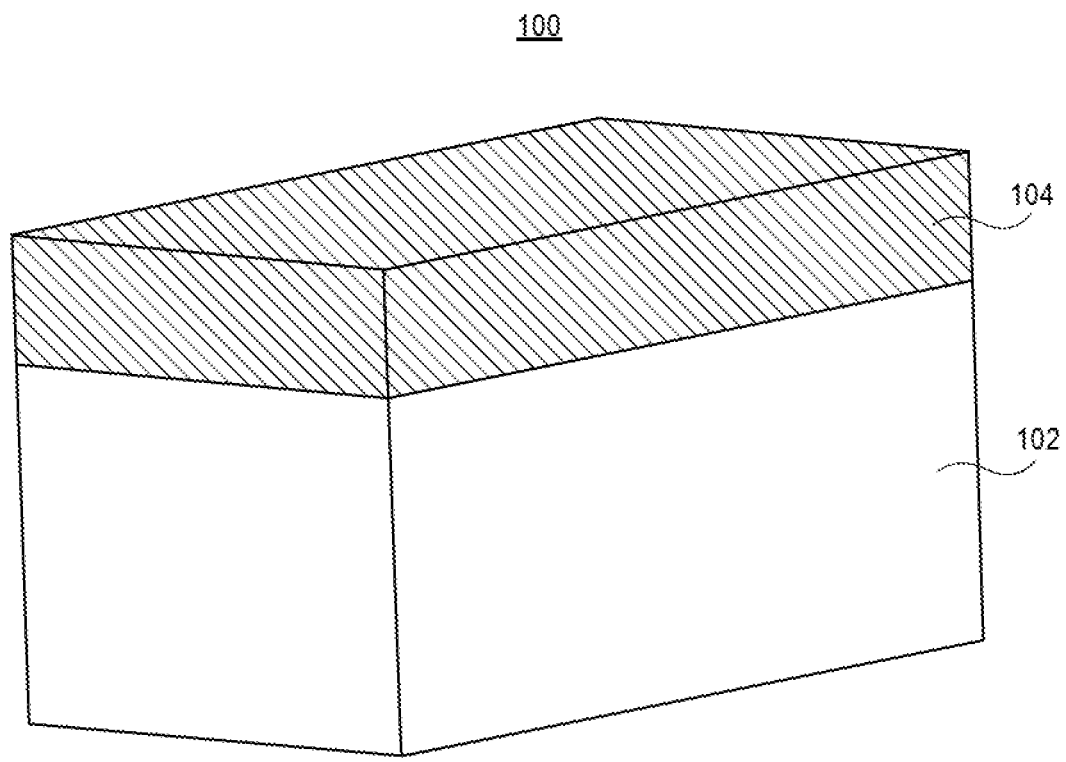
FIGS. 1A-1D and 2 illustrate cross-sectional views representing various operations in a method of fabricating an integrated circuit structure having a source or drain dopant diffusion blocking layer, in accordance with an embodiment of the present disclosure.

Integrated circuit structures having source or drain dopant diffusion blocking layers are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology

The following paragraphs provide definitions or context for terms found in this disclosure (including the appended claims):

"Comprising." This term is open-ended. As used in the appended claims, this term does not foreclose additional structure or operations.

"Configured To." Various units or components may be described or claimed as "configured to" perform a task or tasks. In such contexts, "configured to" is used to connote structure by indicating that the units or components include structure that performs those task or tasks during operation. As such, the unit or component can be said to be configured to perform the task even when the specified unit or component is not currently operational (e.g., is not on or active). Reciting that a unit or circuit or component is "configured to" perform one or more tasks is expressly intended not to invoke 35 U.S.C. § 112, sixth paragraph, for that unit or component.

"First," "Second," etc. As used herein, these terms are used as labels for nouns that they precede, and do not imply any type of ordering (e.g., spatial, temporal, logical, etc.).

"Coupled"—The following description refers to elements or nodes or features being "coupled" together. As used herein, unless expressly stated otherwise, "coupled" means that one element or node or feature is directly or indirectly joined to (or directly or indirectly communicates with) another element or node or feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation or location or both of portions of the component within a consistent but arbitrary frame of reference which is made clear by reference to the text and the associated drawings describing the component under discussion. Such terminology may include the words specifically mentioned above, derivatives thereof, and words of similar import.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, or effect which might otherwise occur. Accordingly, when a component, element, or feature is referred to as inhibiting a result or state, it need not completely prevent or eliminate the result or state.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) get interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments described herein are directed to self-aligned selective P-type metal oxide semiconductor (PMOS) boron diffusion blocking layers for SiGe (or other) channel devices.

To provide context, thermal deltas experienced during processing downstream of source or drain deposition can cause boron to diffuse out of a P-type source or drain structure and into an adjacent channel. The diffusion can lead to a situation where the source or drain and channel boundary become less abrupt, which may result in an increase in undesirable short channel effects. Currently, short channel effects are controlled by anticipating boron diffusion and depositing a source or drain material as spaced away from the channel. However, boron typically still diffuses toward the channel, and results in the regions of the source or drain structure adjacent the channel as having a lower boron concentration when compared to the bulk source/drain structure, or results in a source or drain structure where boron diffusion is not suitably high in some locations. The result may be a higher electrical resistivity in the portion of the source or drain structure near the channel when compared to the remainder of the source or drain structure.

To provide further context, alternative material channel transistors (e.g., SiGe channel-based transistors) on silicon substrates may exhibit enhanced leakage between source and drain in the region below an active gated transistor. Solutions used to solve such issues include the implementation of an oppositely doped layer below the active channel. A possible drawback to oppositely doping the layer below the active channel is that the dopants may diffuse into the active channel material during downstream processing.

In accordance with one or more embodiments of the present disclosure, transistors having a SiGe channel and deposited source or drain structures provide the opportunity to fabricate a Ge rich SiGe layer between the channel and the deposited source or drain material layer. In one embodiment, the Ge rich layer has a total Ge atomic % concentration greater than a total Ge atomic % concentration of the channel regions and a total Ge atomic % concentration of the source or drain structure. In one embodiment, the resulting structure reduces or prevents the diffusion of boron from the source or drain structure into the channel. In an embodiment, the Ge rich SiGe layer is formed by condensation (e.g., of a SiGe source or drain structure of a SiGe channel), selective etching/removal of Si from the SiGe channel prior to source/drain deposition, or as a distinct deposited layer formed prior to bulk SiGe source or drain deposition. In any case, in an embodiment, the above processes are self-aligned selective processes that may be performed between opening a channel for source or drain deposition and the source or drain deposition itself, or as a process performed in-situ with the source or drain deposition.

Embodiments described herein may be implemented to enable scaling of FinFET technologies to future technology nodes based on alternative channel materials and, in particular, to provide structures having an abrupt junction between a source or drain structure and a channel with the location of the junction being controllable without the need for additional processing operations. Embodiments may be implemented in order to enable reduction/blocking of boron diffusion and allow for better control of and reduction in short channel effects.

In accordance with one or more embodiments described herein, a Ge rich boron diffusion blocking layer is fabricated in a location between a doped PMOS source or drain structure and a SiGe channel material. The diffusion blocking layer can further be located between the doped PMOS source or drain structure and an underlying fin. In one embodiment, the presence of a Ge rich blocking layer may be identified by the presence of a relatively higher Ge concentration layer between a source or drain structure and a channel/fin and can be identified via SIMS, TEM EDX mapping, Atom Probe Tomography, and/or TEM images.

In accordance with one or more embodiments of the present disclosure, an exemplary processing scheme utilizing one or more embodiments of the present disclosure is based on a FinFET transistor with a gate first process flow or a gate last process flow. A Ge rich diffusion blocking layer can be either deposited (e.g., in-situ or ex-situ to the source or drain structure), via condensation of a SiGe fin/channel, or by use of a selective etch (e.g., in-situ or ex-situ to source or drain deposition) to effect removal of Si out of a SiGe fin and/or channel structure. Embodiments disclosed herein may be implemented for the fabrication of PMOS and/or CMOS transistors and stacks thereof (but may also be used for NMOS fabrication), alternative architectures such as TFETs, nanowires, nanoribbons and planar transistors, and stacks thereof and for fabrication of a variety of channel materials which can contain Si, Ge, or Sn (or even a III-V material). Associated source or drain (S/D) structure may be fabricated by via etch and fill processing, or through a raised S/D approach.

Advantages of implementing embodiments described herein may include enabling scaling of FinFET technologies to future nodes with alternative channel materials by preventing source to drain leakage below a gated transistor and preventing unwanted diffusion of dopants from a source or drain structure into the active channel. The resulting improvements may ultimately lead to improved transistor performance. Embodiments may be applicable to PMOS transistors in particular, but may also be applicable to NMOS transistors or CMOS structures, alternative architectures such as TFETs and to a variety of channel materials which can contain one or more of Si, Ge, or Sn. Approaches described herein may be used in a transistor fabrication scheme that utilizes epitaxial growth of a channel material and/or epitaxial growth of source or drain structures including strained and unstrained Si, strained and unstrained SiGe, strained and unstrained Ge, or strained and unstrained Si III-V channels. The process flow can be a gate first or a gate last process flow.

As used throughout, unless specifically called out as a doped silicon layer, the term silicon, e.g., as used in silicon substrate or in silicon fin portion, may be used to describe a silicon material composed of a very substantial amount of, if not all, silicon. However, it is to be understood that, practically, 100% pure Si may be difficult to form and, hence, could include a tiny percentage of impurity dopants (such as boron, phosphorous or arsenic) and/or could include a tiny percentage of carbon or germanium. Such impurities may be included as an unavoidable impurity or component during deposition of Si or may "contaminate" the Si upon diffusion during post deposition processing.

As used throughout, unless specifically called out as a doped germanium layer, the term germanium, e.g., as used in germanium nucleation layer or germanium device layer or germanium channel structure, may be used to describe a germanium material composed of a very substantial amount of, if not all, germanium. However, it is to be understood that, practically, 100% pure Ge may be difficult to form and, hence, could include a tiny percentage of impurity dopants (such as boron, phosphorous or arsenic) and/or could include a tiny percentage of silicon or carbon. Such impurities may be included as an unavoidable impurity or component during deposition of Ge or may "contaminate" the Ge upon diffusion during post deposition processing. As such, embodiments described herein directed to a germanium nucleation layer or germanium device layer or germanium channel structure may include a germanium nucleation layer or germanium device layer or germanium channel structure that contains a relatively small amount, e.g., "impurity" level, non-Ge atoms or species, such as Si.

As used throughout, unless specifically called out as a doped silicon germanium layer, the term silicon germanium, e.g., as used in silicon germanium device layer or silicon germanium channel structure, may be used to describe a silicon germanium material composed of substantial portions of both silicon and germanium, such as at least 5% of both. In some embodiments, the amount of germanium is greater than the amount of silicon. In particular embodiments, a silicon germanium layer includes approximately 70% germanium and approximately 30% silicon ($Si_{30}Ge_{70}$). In other embodiments, the amount of silicon is greater than the amount of germanium. It is to be understood that, practically, 100% pure silicon germanium (referred to generally as SiGe) may be difficult to form and, hence, could include a tiny percentage of impurity dopants (such as boron, phosphorous or arsenic) and/or could include a tiny percentage of carbon. Such impurities may be included as an unavoidable impurity or component during deposition of SiGe or may "contaminate" the SiGe upon diffusion during post deposition processing. As such, embodiments described herein directed to a silicon germanium device layer or a silicon germanium channel structure may include a silicon germanium device layer or a silicon germanium channel structure that contains a relatively small amount, e.g., "impurity" level, non-Ge atoms or species.

As an exemplary processing scheme and resulting structure, FIGS. 1A-1D and 2 illustrate cross-sectional views representing various operations in a method of fabricating an integrated circuit structure having a source or drain dopant diffusion blocking layer, in accordance with an embodiment of the present disclosure.

Referring to FIG. 1A, fabrication of a starting structure 100 includes formation of a channel material layer 104 on a substrate 102. In an embodiment, channel material layer 104 is an epitaxially grown layer. In an embodiment, channel material layer 104 is a SiGe channel material, and substrate 102 is a doped or undoped silicon bulk substrate or a silicon layer. In an alternative embodiment, an aspect ratio trapping scheme may be used where channel materials are grown within a trench.

Figure 1B:
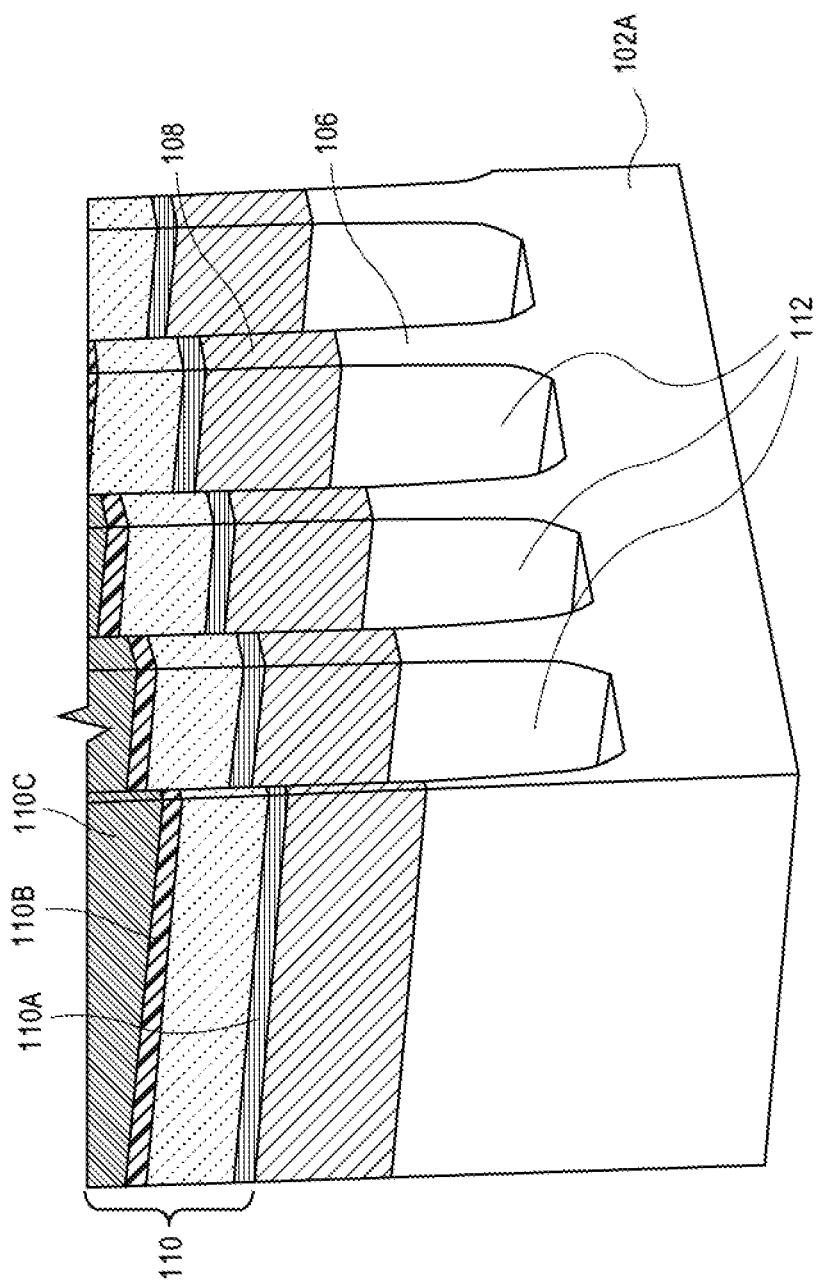

Referring to FIG. 1B, the starting structure 100 of FIG. 1A is patterned to form a plurality of fins. In an embodiment, a patterning layer 110 is formed on structure 100. The patterning layer 110 may be a trilayer mask composed of a hardmask portion 110A, an anti-reflective coating (ARC) layer 110B, and a photoresist layer 110C. In one embodiment, all of patterning layer 110 is sacrificial and is removed after patterning to provide tri-gate fins. In another embodiment, a portion of hardmask 110, such as a silicon nitride hardmask, is retained in the final structure, as is depicted herein, to provide a FinFET-type structure. In an embodiment, the fins include a fin portion 108 fabricated from the channel material layer 104, and a fin portion 106 fabricated from the substrate 102, leaving a modified substrate portion 102A. Trenches 112 are between adjacent fins.

Figure 1C:
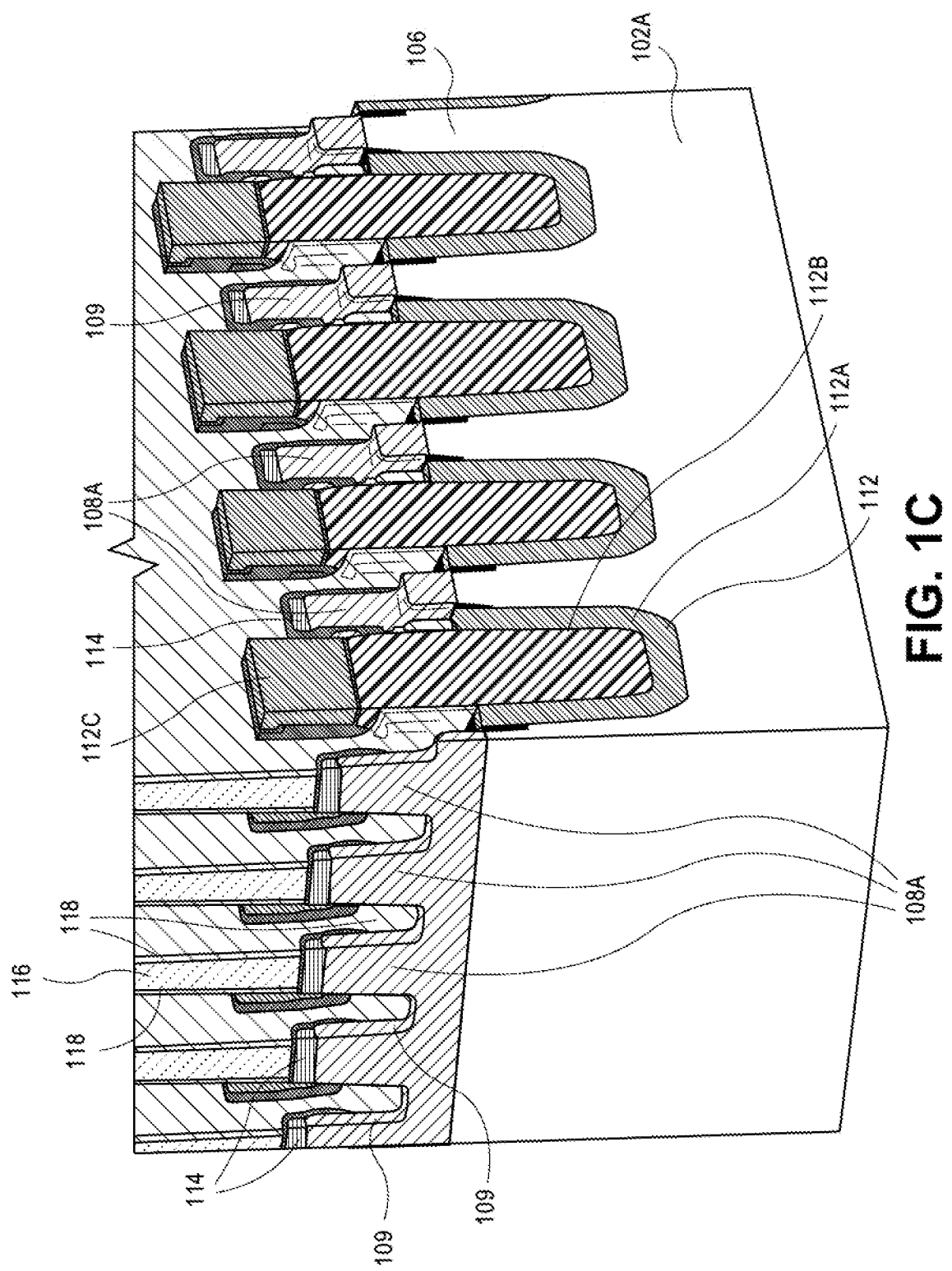

Referring to FIG. 1C, isolation structures are formed in trenches 112 between adjacent fins. In one embodiment, the isolation structures include a trench isolation layer 112A, a fill dielectric 112B, and a capping dielectric 112C, as is depicted. The isolation structure may ultimately act as gate endcap structures, as is described in greater detail below.

Referring again to FIG. 1C, gate structures 116 are formed over the fins 108/106 and, possibly, over the isolation structures in trenches 112. In an embodiment, gate structures 116 are dummy gate structures that are removed at a later processing operation. The dummy gate structures include a dummy gate electrode and, possibly, a dummy gate dielectric. In one such embodiment, the dummy gate electrode is a polysilicon gate electrode. In another embodiment, 116 are permanent gate structures including a permanent gate electrode and gate dielectric. In one such embodiment, the permanent gate electrode includes a metal gate, and the permanent gate dielectric includes a high-k dielectric layer. In an embodiment, as depicted, gate structures are formed on a hardmask 114 (such as a silicon nitride hardmask remaining from patterning stack 110). In another embodiment, gate structures are formed directly on fins 108/106, and hardmask 114 is not included.

In an embodiment, trenches 109 are formed in fin portion 108 to formed etched fin portion 108A. Trenches 109 are between adjacent gate structures 116, e.g., at source or drain locations. In an embodiment, gate dielectric spacers 118 are along sidewalls of gate structures 116. In a particular such embodiment, gate dielectric spacers 118 are further formed along fin sidewalls at locations between the gate structures 116. In such a case, removal of a portion of fin portion 108 to form trenches 109 in source or drain locations reveals a portion of the gate dielectric spacers 118 initially formed along fin sidewalls, as is depicted.

Figure 1D:
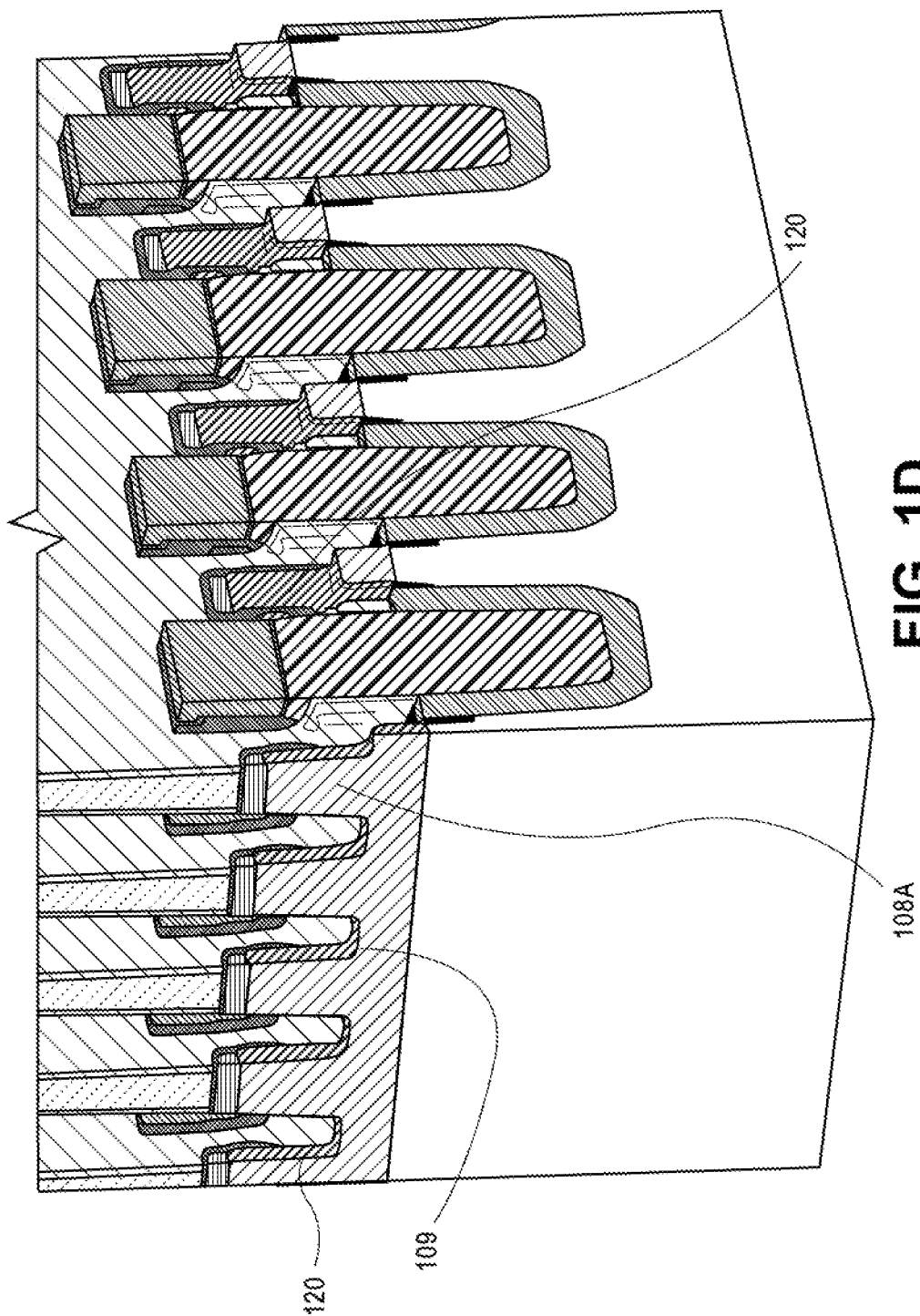

Referring to FIG. 1D, a blocking layer 120 is formed in the trenches 109 of the structure of FIG. 1C. In an embodiment, blocking layer 120 is a silicon germanium (SiGe) blocking layer.

Figure 2:
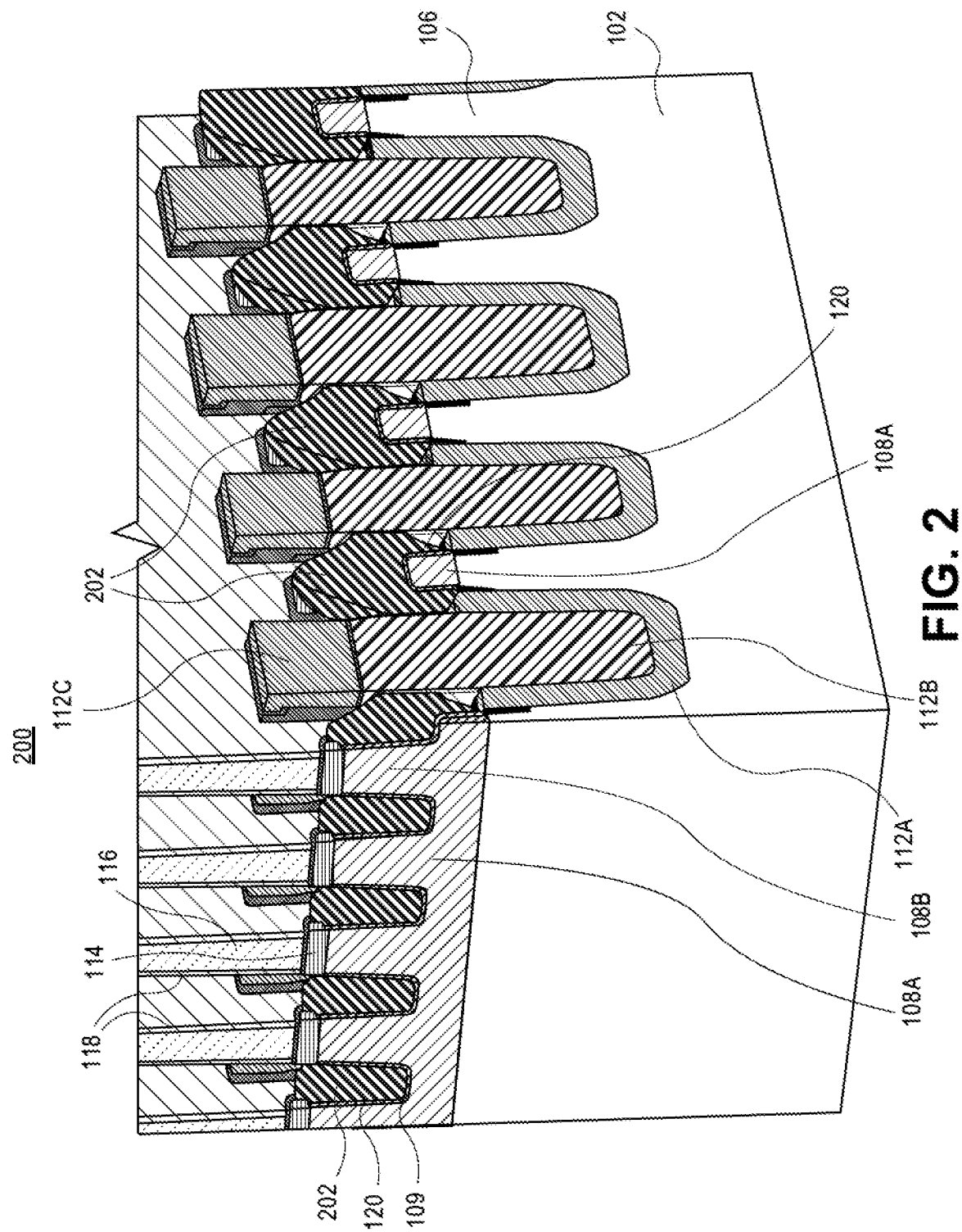

Referring to FIG. 2, a source or drain material 202 is formed on the blocking layer 120 of FIG. 1D. In one embodiment, the source or drain material 202 is a boron-doped silicon germanium source or drain material. In a specific embodiment, source or drain material 202 is faceted between the isolation structures 112A/112B/112C, as is depicted. In an embodiment, source or drain material 202 completely fills the remainder of trench 109 that is not filled by blocking layer 120, as is also depicted.

With exemplary reference to FIGS. 1A-1D and 2, in accordance with an embodiment of the present disclosure, a method of fabricating an integrated circuit structure 200 includes forming a fin 108/106 including silicon. A gate structure 116 is formed over a channel region 108B of the fin 108/106, the gate structure 116 having a first side opposite a second side. Portions of the fin 108/106 are etched at the first and second sides of the gate structure 116, e.g., to formed trenches 109 in fin portion 108 providing etched fin portion 108A. First and second source or drain structures 120/202 are formed in the etched regions 109 of the fin 108A/106 at the first and second sides of the gate structure 116, respectively. The first and second source or drain structures 120/202 include a first semiconductor layer 120 in contact with the channel region 108B of the fin 108A/106, and a second semiconductor layer 202 on the first semiconductor layer 120. The first semiconductor layer 120 includes a greater concentration of germanium than the second semiconductor layer 202, and the second semiconductor layer 202 includes boron dopant impurity atoms.

In an embodiment, the first and second source or drain structures 120/202 are formed by epitaxially depositing the first 120 and second 202 semiconductor layers. In another embodiment, the first and second source or drain structures 120/202 are formed by forming a silicon germanium material in the etched regions 109 of the fin 108A/106 at the first and second sides of the gate structure 116 and then condensing germanium from the silicon germanium material to a location in contact with the channel region 108B, e.g., to form blocking layer 120. In another embodiment, the fin 108A/106 further includes germanium (e.g., as silicon germanium fin portion 108A), and the first and second source or drain structures 120/202 are formed by removing silicon from outer portions of the channel region 108B, e.g., to form blocking layer 120. Silicon germanium material 202 is then formed in the etched regions of the fin 109 at the first and second sides of the gate structure 116, e.g., to form source or drain material 202.

With exemplary reference to FIG. 2, in accordance with an embodiment of the present disclosure, an integrated circuit structure 202 includes a fin 108A/106 including silicon. A gate structure 116 is over a channel region 108B of the fin 108A/106, the gate structure 116 having a first side opposite a second side. A first source or drain structure 120/202 is at the first side of the gate structure 116. A second source or drain structure 120/202 is at the second side of the gate structure 116. The first and second source or drain structures 120/202 include a first semiconductor layer 120 and a second semiconductor layer 202. The first semiconductor layer 120 is in contact with the channel region 108B of the fin 108B/106. The second semiconductor layer 202 is on the first semiconductor layer 120. In one embodiment, the first semiconductor layer 120 has a greater concentration of germanium than the second semiconductor layer 202, and the second semiconductor layer 202 includes boron dopant impurity atoms.

In an embodiment, the first semiconductor layer 120 includes silicon germanium, and the second semiconductor layer 202 includes silicon germanium. In another embodiment, the first semiconductor layer 120 consists essentially of germanium, and the second semiconductor layer 202 includes silicon germanium.

In an embodiment, the fin 108A/106 further includes germanium (e.g., as portion 108A), and the first semiconductor layer 120 has a greater concentration of germanium than the fin and, in a particular embodiment, a greater concentration of germanium than the portion 108A of the fin. In one such embodiment, the fin includes silicon germanium (e.g., as layer 108A), the first semiconductor layer 120 includes silicon germanium, and the second semiconductor layer 202 includes silicon germanium. In another such embodiment, the fin includes silicon germanium (e.g., as layer 108A), the first semiconductor layer 120 consists essentially of germanium, and the second semiconductor layer 202 includes silicon germanium.

In an embodiment, the fin 108A/106 includes a sub-fin structure including an upper silicon germanium layer (e.g., lower portion of 108A) and a lower silicon layer 106. In one such embodiment, the lower silicon layer 106 of the sub-fin structure is continuous with a bulk silicon substrate. In an embodiment, the first and second source or drain structures 120/202 are first and second epitaxial source or drain structures embedded in the fin 108A/106 at the first and second sides of the gate structure 116, respectively.

In an embodiment, the gate structure is adjacent a gate endcap structure. For example, gate structures 116 of FIG. 2 may ultimately be recessed to a height below a height of isolation structures 112A/112B/112C, to yield isolation structures 112A/112B/112C as gate endcap structures. Thus, in an embodiment, a self-aligned gate endcap (SAGE) processing scheme involves the formation of gate endcaps self-aligned to fins without requiring extra die area to account for mask mis-registration. Thus, embodiments may be implemented to enable shrinking of transistor layout area. Embodiments described throughout may involve the fabrication of gate endcap isolation structures, which may also be referred to as gate walls, isolation gate walls or self-aligned gate endcap (SAGE) walls.

Referring again to FIG. 2, as a specific exemplary embodiment, an integrated circuit structure 200 includes a fin 108A/106 including silicon. A P-type gate structure 116 is over a channel region 108B of the fin 108A/106, the gate structure 116 having a first side opposite a second side. A first P-type source or drain structure 120/202 is at the first side of the P-type gate structure 116. A second P-type source or drain structure 120/202 is at the second side of the P-type gate structure 116. The first and second P-type source or drain structures 120/202 include a dopant diffusion blocking layer 120 in contact with the channel region 108B of the fin 120/202. A boron-doped semiconductor layer 202 is on the dopant diffusion blocking layer 120.

Figure 3A:
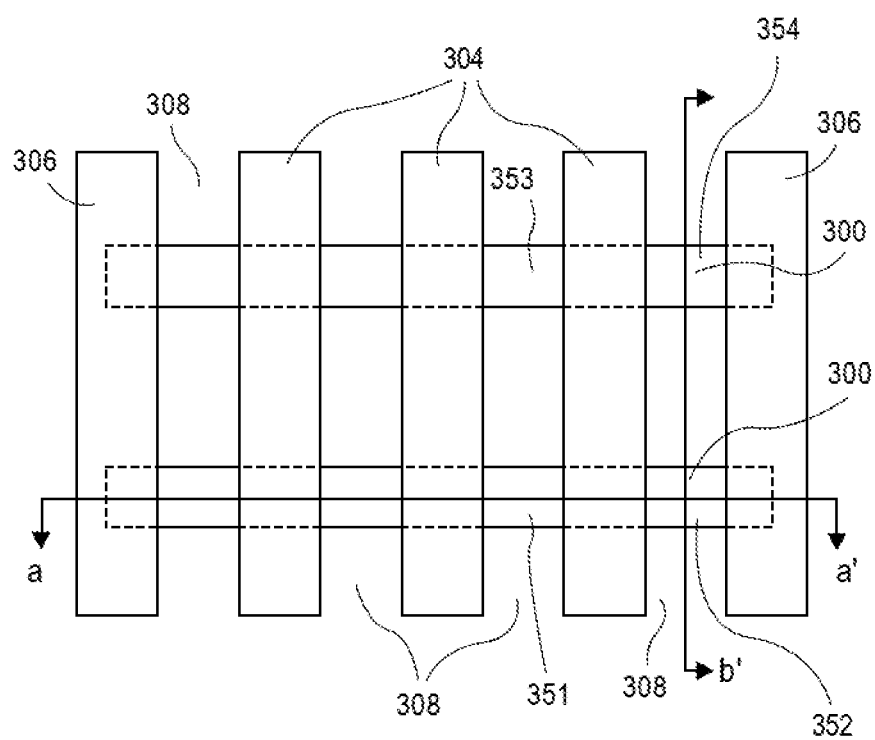
FIG. 3A illustrates a plan view of a plurality of gate lines over a pair of semiconductor fins, in accordance with another embodiment of the present disclosure.
Figure 3B:
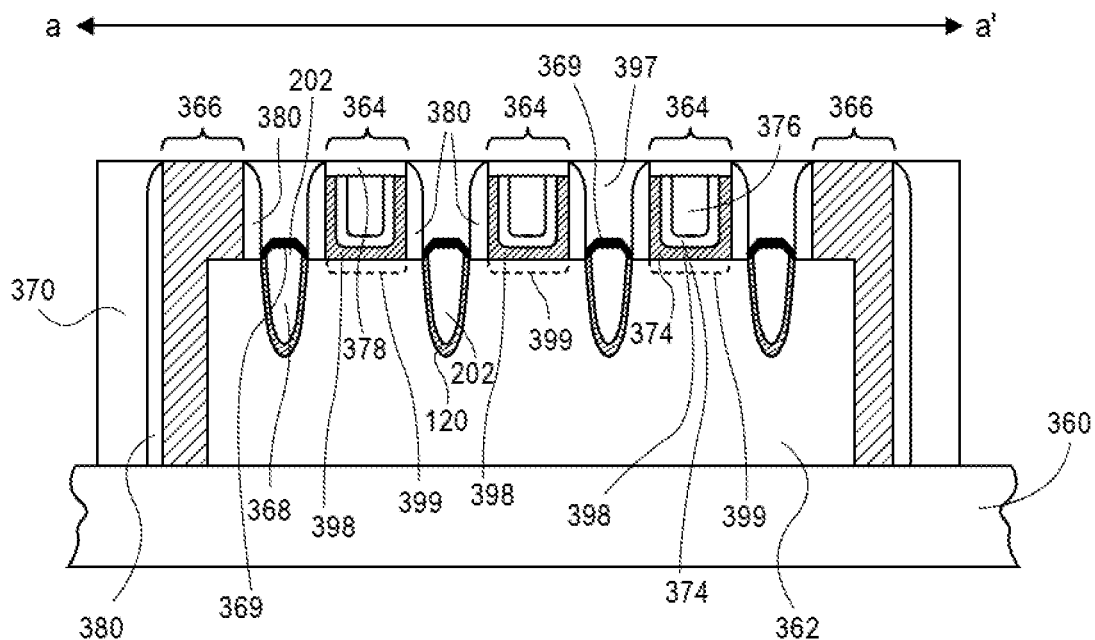
FIG. 3B illustrates a cross-sectional view, taken along the a-a' axis of FIG. 3A, in accordance with an embodiment of the present disclosure.

In another aspect, FIG. 3A illustrates a plan view of a plurality of gate lines over a pair of semiconductor fins, in accordance with another embodiment of the present disclosure. FIG. 3B illustrates a cross-sectional view, taken along the a-a' axis of FIG. 3A, in accordance with an embodiment of the present disclosure.

Referring to FIG. 3A, a plurality of active gate lines 304 is formed over a plurality of semiconductor fins 300. Dummy gate lines 306 are at the ends of the plurality of semiconductor fins 300. Spacings 308 between the gate lines 304/306 are locations where trench contacts may be located to provide conductive contacts to source or drain regions, such as source or drain regions 351, 352, 353, and 354. In an embodiment, the pattern of the plurality of gate lines 304/306 or the pattern of the plurality of semiconductor fins 300 is described as a grating structure. In one embodiment, the grating-like pattern includes the plurality of gate lines 304/306 and/or the pattern of the plurality of semiconductor fins 300 spaced at a constant pitch and having a constant width, or both.

Referring to FIG. 3B, a plurality of active gate lines 364 is formed over a semiconductor fin 362 formed above a substrate 360. Dummy gate lines 366 are at the ends of the semiconductor fin 362. A dielectric layer 370 is outside of the dummy gate lines 366. A trench contact material 397 is between the active gate lines 364, and between the dummy gate lines 366 and the active gate lines 364. Embedded lower source or drain structures 368 and corresponding capping semiconductor layers 369, if present, are in the semiconductor fin 362 between the active gate lines 364 and between the dummy gate lines 366 and the active gate lines 364. In an embodiment, as depicted, embedded lower source or drain structures 368 include a dopant diffusion blocking layer 120, and may further include a boron-doped semiconductor layer 202 on the dopant diffusion blocking layer 120, examples of which are described above in association with FIGS. 1A-1D and 2.

The active gate lines 364 include a gate dielectric structure 398/399, a workfunction gate electrode portion 374 and a fill gate electrode portion 376, and a dielectric capping layer 378. Dielectric spacers 380 line the sidewalls of the active gate lines 364 and the dummy gate lines 366.

In another aspect, trench contact structures, e.g., for source or drain regions, are described. In an example, FIG. 4 illustrates a cross-sectional view of an integrated circuit structure having trench contacts for a PMOS device, in accordance with another embodiment of the present disclosure.

Figure 4:
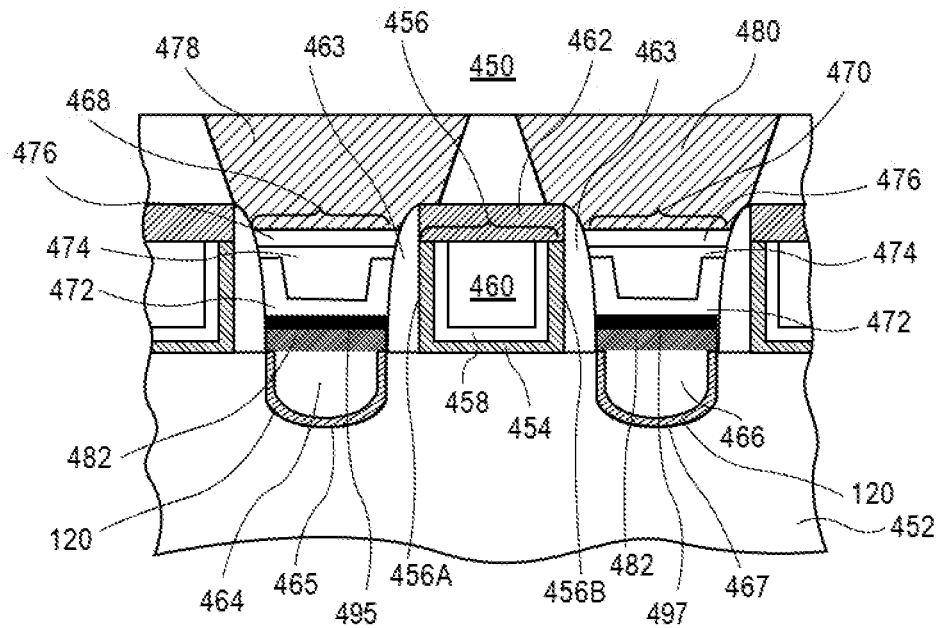
FIG. 4 illustrates a cross-sectional view of an integrated circuit structure having trench contacts, in accordance with another embodiment of the present disclosure.

Referring to FIG. 4, an integrated circuit structure 450 includes a fin 452. A gate dielectric layer 454 is over fin 452. A gate electrode 456 is over the gate dielectric layer 454. In an embodiment, the gate electrode 456 includes a conformal conductive layer 458 and a conductive fill 460. In an embodiment, a dielectric cap 462 is over the gate electrode 456 and over the gate dielectric layer 454. The gate electrode has a first side 456A and a second side 456B opposite the first side 456A. Dielectric spacers are along the sidewalls of the gate electrode 456. In one embodiment, the gate dielectric layer 454 is further between a first of the dielectric spacers 463 and the first side 456A of the gate electrode 456, and between a second of the dielectric spacers 463 and the second side 456B of the gate electrode 456, as is depicted. In an embodiment, although not depicted, a thin oxide layer, such as a thermal or chemical silicon oxide or silicon dioxide layer, is between the semiconductor fin 452 and the gate dielectric layer 454.

First 464 and second 466 semiconductor source or drain regions are adjacent the first 456A and second 456B sides of the gate electrode 456, respectively. In one embodiment, the first 464 and second 466 semiconductor source or drain regions include embedded epitaxial lower regions and may include corresponding source or drain capping semiconductor layers 495 or 497 (which may act as trench contact etch stop layers), and are formed in recesses 465 and 467, respectively, of the semiconductor fin 452, as is depicted. In an embodiment, as depicted, first 464 and second 466 semiconductor source or drain regions include a dopant diffusion blocking layer 120, and may further include a boron-doped semiconductor layer on the dopant diffusion blocking layer 120, examples of which are described above in association with FIGS. 1A-1D and 2.

First 468 and second 470 trench contact structures are over the first 464 and second 466 semiconductor source or drain regions adjacent the first 456A and second 456B sides of the gate electrode 456, respectively. The first 468 and second 470 trench contact structures both include a U-shaped metal layer 472 and a T-shaped metal layer 474 on and over the entirety of the U-shaped metal layer 472. In one embodiment, the U-shaped metal layer 472 and the T-shaped metal layer 474 differ in composition. In one such embodiment, the U-shaped metal layer 472 includes titanium, and the T-shaped metal layer 474 includes cobalt. In one embodiment, the first 468 and second 470 trench contact structures both further include a third metal layer 476 on the T-shaped metal layer 474. In one such embodiment, the third metal layer 476 and the U-shaped metal layer 472 have a same composition. In a particular embodiment, the third metal layer 476 and the U-shaped metal layer 472 include titanium, and the T-shaped metal layer 474 includes cobalt.

A first trench contact via 478 is electrically connected to the first trench contact 468. In a particular embodiment, the first trench contact via 478 is on and coupled to the third metal layer 476 of the first trench contact 468. The first trench contact via 478 is further over and in contact with a portion of one of the dielectric spacers, and over and in contact with a portion of the dielectric cap 462. A second trench contact via 480 is electrically connected to the second trench contact 470. In a particular embodiment, the second trench contact via 480 is on and coupled to the third metal layer 476 of the second trench contact 470. The second trench contact via 480 is further over and in contact with a portion of another of the dielectric spacers 463, and over and in contact with another portion of the dielectric cap 462.

In an embodiment, a metal silicide layer 482 is directly between the first 468 and second 470 trench contact structures and the first 464 and second 466 semiconductor source or drain regions, respectively, and may extend below the capping layers 495 and 497, as depicted. In one embodiment, the metal silicide layer 482 includes nickel, platinum and silicon. In a particular such embodiment, the first 464 and second 466 semiconductor source or drain regions are first and second P-type semiconductor source or drain regions. In one embodiment, the metal silicide layer 482 further includes germanium. In one embodiment, the metal silicide layer 482 further includes titanium.

One or more embodiments described herein are directed to the use of metal chemical vapor deposition for wrap-around semiconductor contacts. Embodiments may be applicable to or include one or more of chemical vapor deposition (CVD), plasma enhanced chemical vapor deposition (PECVD), atomic layer deposition (ALD), conductive contact fabrication, or thin films. Particular embodiments may include the fabrication of a titanium or like metallic layer using a low temperature (e.g., less than 500 degrees Celsius, or in the range of 400-500 degrees Celsius) chemical vapor deposition of a contact metal to provide a conformal source or drain contact. Implementation of such a conformal source or drain contact may improve three-dimensional (3D) transistor complementary metal oxide semiconductor (CMOS) performance.

To provide context, metal to semiconductor contact layers may be deposited using sputtering. Sputtering is a line of sight process and may not be well suited to 3D transistor fabrication. Known sputtering solutions have poor or incomplete metal-semiconductor junctions on device contact surfaces with an angle to the incidence of deposition. In accordance with one or more embodiments of the present disclosure, a low temperature chemical vapor deposition process is implemented for fabrication of a contact metal to provide conformality in three dimensions and maximize the metal semiconductor junction contact area. The resulting greater contact area may reduce the resistance of the junction. Embodiments may include deposition on semiconductor surfaces having a non-flat topography, where the topography of an area refers to the surface shapes and features themselves, and a non-flat topography includes surface shapes and features or portions of surface shapes and features that are non-flat, i.e., surface shapes and features that are not entirely flat. In an embodiment, deposition is on a semiconductor surface of a source or drain structure having a relatively high germanium content.

Embodiments described herein may include fabrication of wrap-around contact structures. In one such embodiment, the use of pure metal conformally deposited onto transistor source-drain contacts by chemical vapor deposition, plasma enhanced chemical vapor deposition, atomic layer deposition, or plasma enhanced atomic layer deposition is described. Such conformal deposition may be used to increase the available area of metal semiconductor contact and reduce resistance, improving the performance of the transistor device. In an embodiment, the relatively low temperature of the deposition leads to a minimized resistance of the junction per unit area.

It is to be appreciated that a variety of integrated circuit structures may be fabricated using an integration scheme involving a metallic layer deposition process as described herein. In accordance with an embodiment of the present disclosure, a method of fabricating an integrated circuit structure includes providing a substrate in a chemical vapor deposition (CVD) chamber having an RF source, the substrate having a feature thereon. The method also includes reacting titanium tetrachloride ($TiCl_4$) and hydrogen ($H_2$) to form a titanium (Ti) layer on the feature of the substrate. In an embodiment, the titanium layer has a total atomic composition including 98% or greater of titanium and 0.5-2% of chlorine. In alternative embodiments, a similar process is used to fabricate a high purity metallic layer of zirconium (Zr), hafnium (Hf), tantalum (Ta), niobium (Nb), or vanadium (V).

In accordance with an embodiment of the present disclosure, the feature of the substrate is a source or drain contact trench exposing a semiconductor source or drain structure. The titanium layer (or other high purity metallic layer) is a conductive contact layer for the semiconductor source or drain structure. Exemplary embodiments of such an implementation are described below in association with FIG. 5.

Figure 5:
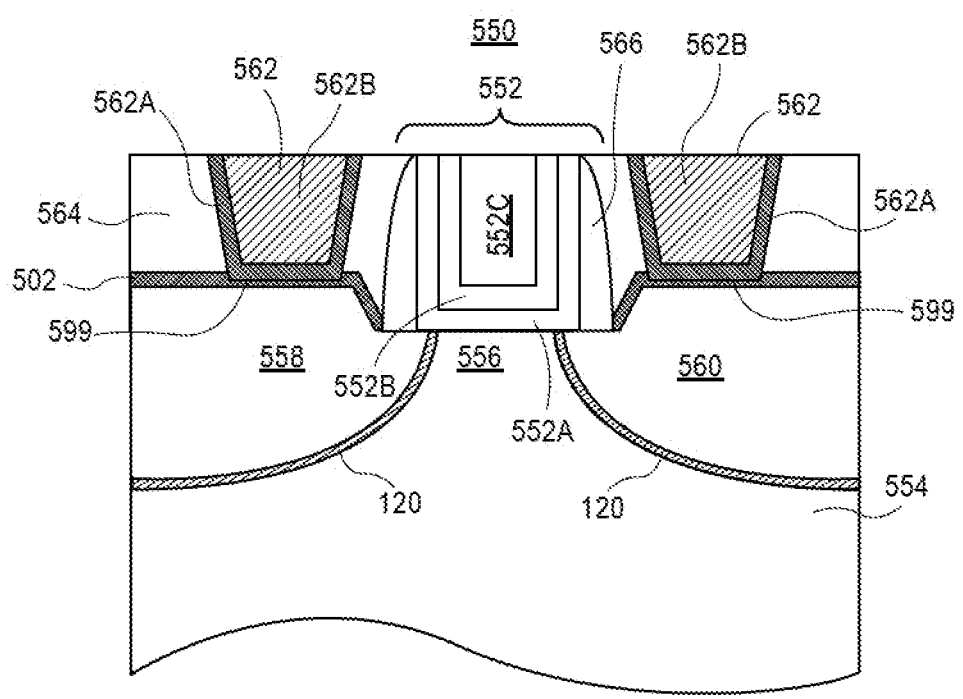
FIG. 5 illustrates a cross-sectional view of an integrated circuit structure having a conductive contact on a raised source or drain region, in accordance with an embodiment of the present disclosure.

FIG. 5 illustrates a cross-sectional view of an integrated circuit structure having a conductive contact on a raised source or drain region, in accordance with an embodiment of the present disclosure.

Referring to FIG. 5, a semiconductor structure 550 includes a gate structure 552 above a substrate 554. The gate structure 552 includes a gate dielectric layer 552A, a work-function layer 552B, and a gate fill 552C. A source region 558 and a drain region 560 are on opposite sides of the gate structure 552. Source or drain contacts 562 are electrically connected to the source region 558 and the drain region 560, and are spaced apart of the gate structure 552 by one or both of an inter-layer dielectric layer 564 or gate dielectric spacers 566. In an embodiment, the source region 558 and the drain region 560 include epitaxial or embedded lower material regions formed in etched-out regions of the substrate 554, and corresponding source or drain capping semiconductor layers 502. In an embodiment, as depicted, source region 558 and drain region 560 include a dopant diffusion blocking layer 120, and may further include a boron-doped semiconductor layer on the dopant diffusion blocking layer 120, examples of which are described above in association with FIGS. 1A-1D and 2.

In an embodiment, the source or drain contacts 562 include a high purity metallic layer 562A, such as described above, and a conductive trench fill material 562B. In one embodiment, the high purity metallic layer 562A has a total atomic composition including 98% or greater of titanium. In one such embodiment, the total atomic composition of the high purity metallic layer 562A further includes 0.5-2% of chlorine. In an embodiment, the high purity metallic layer 562A has a thickness variation of 30% or less. In an embodiment, the conductive trench fill material 562B is composed of a conductive material such as, but not limited to, Cu, Al, W, or alloys thereof.

In another aspect, contact over active gate (COAG) structures and processes are described. One or more embodiments of the present disclosure are directed to semiconductor structures or devices having one or more gate contact structures (e.g., as gate contact vias) disposed over active portions of gate electrodes of the semiconductor structures or devices. One or more embodiments of the present disclosure are directed to methods of fabricating semiconductor structures or devices having one or more gate contact structures formed over active portions of gate electrodes of the semiconductor structures or devices. Approaches described herein may be used to reduce a standard cell area by enabling gate contact formation over active gate regions. In one or more embodiments, the gate contact structures fabricated to contact the gate electrodes are self-aligned via structures.

In an embodiment, an integrated circuit structure, semiconductor structure or device is a non-planar device such as, but not limited to, a fin-FET or a tri-gate device. In such an embodiment, a corresponding semiconducting channel region is composed of or is formed in a three-dimensional body. In one such embodiment, gate electrode stacks of gate lines surround at least a top surface and a pair of sidewalls of the three-dimensional body. In another embodiment, at least the channel region is made to be a discrete three-dimensional body, such as in a gate-all-around device. In one such embodiment, gate electrode stacks of gate lines each completely surrounds the channel region.

More generally, one or more embodiments are directed to approaches for, and structures formed from, landing a gate contact via directly on an active transistor gate. Such approaches may eliminate the need for extension of a gate line on isolation for contact purposes. Such approaches may also eliminate the need for a separate gate contact (GCN) layer to conduct signals from a gate line or structure. In an embodiment, eliminating the above features is achieved by recessing contact metals in a trench contact (TCN) and introducing an additional dielectric material in the process flow (e.g., TILA). The additional dielectric material is included as a trench contact dielectric cap layer with etch characteristics different from the gate dielectric material cap layer already used for trench contact alignment in a gate aligned contact process (GAP) processing scheme (e.g., GILA).

In an embodiment, providing an integrated circuit structure involves formation of a contact pattern which is essentially perfectly aligned to an existing gate pattern while eliminating the use of a lithographic operation with exceedingly tight registration budget. In one such embodiment, this approach enables the use of intrinsically highly selective wet etching (e.g., versus dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in other approaches. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, gate structures may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including $SF_6$. In another embodiment, dummy gates are composed of polycrystalline silicon or amorphous silicon and are removed with a wet etch process including aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at an integrated circuit structure. In one such embodiment, the replacement contact process is performed after the replacement gate process to allow high temperature anneal of at least a portion of the permanent gate structure. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

It is to be appreciated that differing structural relationships between an insulating gate cap layer and an insulating trench contact cap layer may be fabricated. As examples, FIGS. 6A and 6B illustrate cross-sectional views of various integrated circuit structures, each having trench contacts including an overlying insulating cap layer and having gate structures including an overlying insulating cap layer, in accordance with an embodiment of the present disclosure.

Figure 6A:
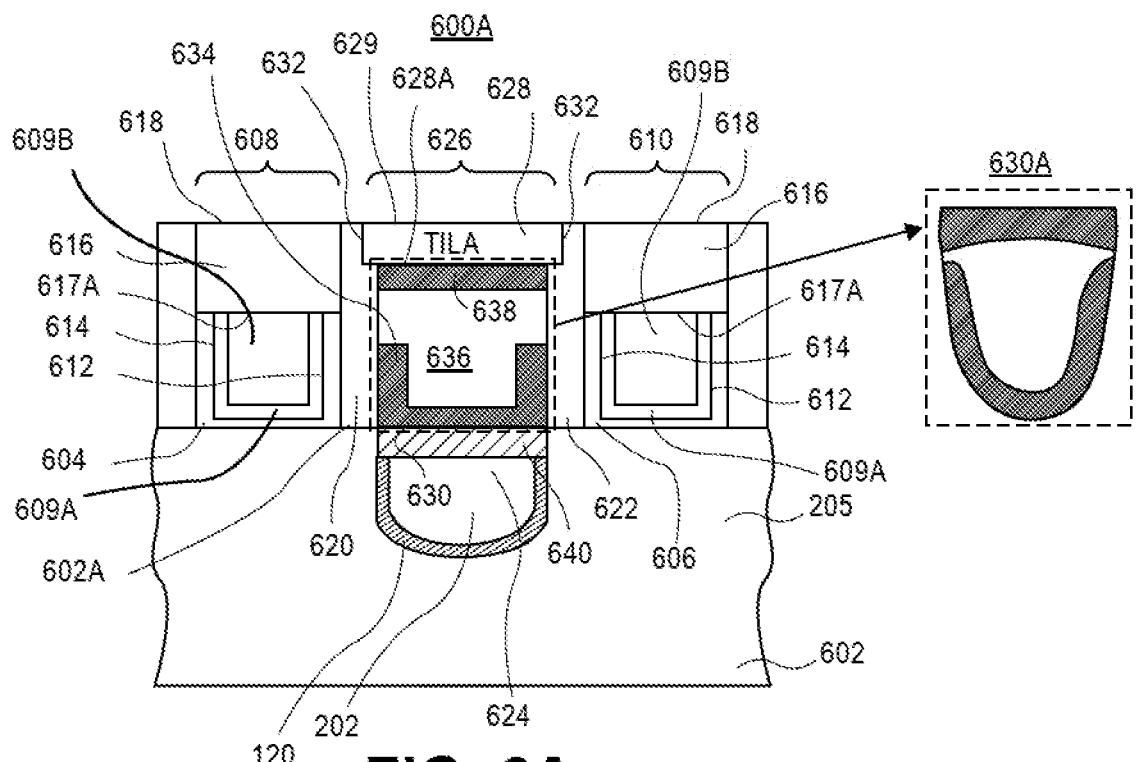
FIGS. 6A and 6B illustrate cross-sectional views of various integrated circuit structures, each having trench contacts including an overlying insulating cap layer and having gate structures including an overlying insulating cap layer, in accordance with an embodiment of the present disclosure.
Figure 6B:
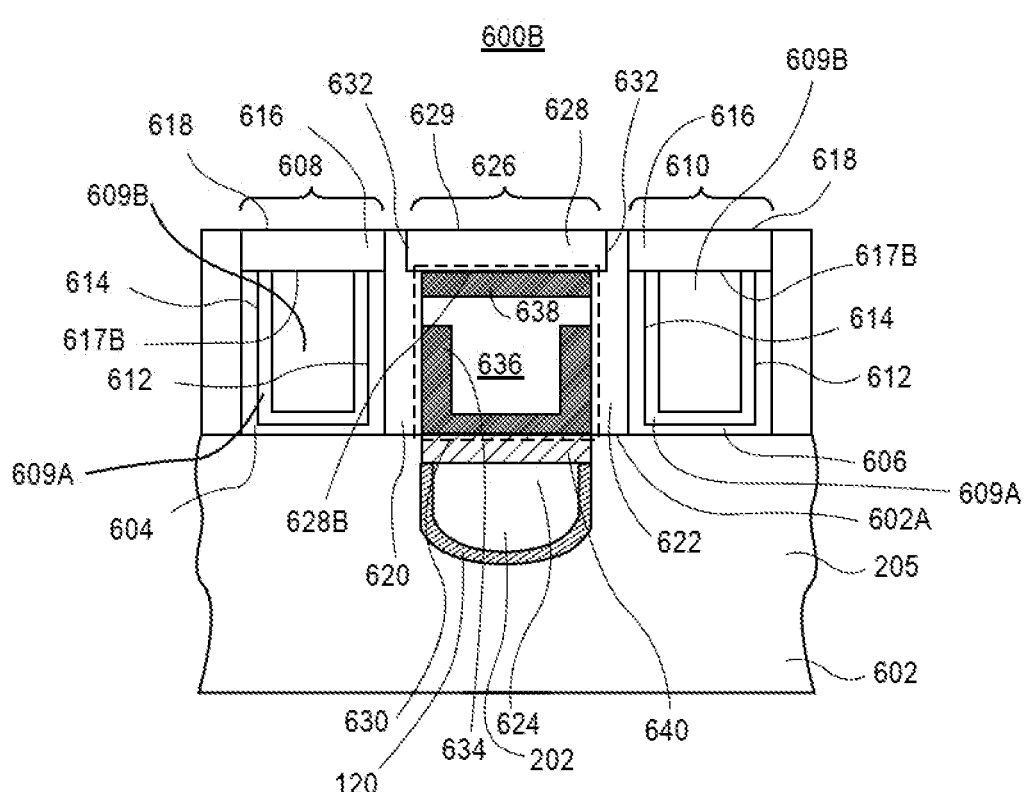

Referring to FIGS. 6A and 6B, integrated circuit structures 600A and 600B, respectively, include a fin 602. Although depicted as a cross-sectional view, it is to be appreciated that the fin 602 has a top 602A and sidewalls (into and out of the page of the perspective shown). First 604 and second 606 gate dielectric layers are over the top 602A of the fin 602 and laterally adjacent the sidewalls of the fin 602. First 608 and second 610 gate electrodes are over the first 604 and second 606 gate dielectric layers, respectively, over the top 602A of the fin 602 and laterally adjacent the sidewalls of the fin 602. The first 608 and second 610 gate electrodes each include a conformal conductive layer 609A, such as a workfunction-setting layer, and a conductive fill material 609B above the conformal conductive layer 609A. The first 608 and second 610 gate electrodes both have a first side 612 and a second side 614 opposite the first side 612. The first 608 and second 610 gate electrodes also both have an insulating cap 616 having a top surface 618.

A first dielectric spacer 620 is adjacent the first side 612 of the first gate electrode 608. A second dielectric spacer 622 is adjacent the second side 614 of the second gate electrode 610. A semiconductor source or drain region 624 is adjacent the first 620 and second 622 dielectric spacers. A trench contact structure 626 is over the semiconductor source or drain region 624 adjacent the first 620 and second 622 dielectric spacers. In an embodiment, as depicted, semiconductor source or drain regions 624 include a dopant diffusion blocking layer 120, and may further include a boron-doped semiconductor layer 202 on the dopant diffusion blocking layer 120, examples of which are described above in association with FIGS. 1A-1D and 2.

The trench contact structure 626 includes an insulating cap 628 on a conductive structure 630. The insulating cap 628 of the trench contact structure 626 has a top surface 629 substantially co-planar with a top surfaces 618 of the insulating caps 616 of the first 608 and second 610 gate electrodes. In an embodiment, the insulating cap 628 of the trench contact structure 626 extends laterally into recesses 632 in the first 620 and second 622 dielectric spacers. In such an embodiment, the insulating cap 628 of the trench contact structure 626 overhangs the conductive structure 630 of the trench contact structure 626. In other embodiments, however, the insulating cap 628 of the trench contact structure 626 does not extend laterally into recesses 632 in the first 620 and second 622 dielectric spacers and, hence, does not overhang the conductive structure 630 of the trench contact structure 626.

In an embodiment, the conductive structure 630 of the trench contact structure 626 includes a U-shaped metal layer 634, a T-shaped metal layer 636 on and over the entirety of the U-shaped metal layer 634, and a third metal layer 638 on the T-shaped metal layer 636. The insulating cap 628 of the trench contact structure 626 is on the third metal layer 638. In one such embodiment, the third metal layer 638 and the U-shaped metal layer 634 include titanium, and the T-shaped metal layer 636 includes cobalt. In a particular such embodiment, the T-shaped metal layer 636 further includes carbon.

It is to be appreciated that the conductive structure 630 of the trench contact structure 626 may not be rectangular, as depicted in FIGS. 6A and 6B. For example, the conductive structure 630 of the trench contact structure 626 may have a cross-sectional geometry similar to or the same as the geometry shown for conductive structure 630A illustrated in the projection of FIG. 6A.

In an embodiment, the insulating cap 628 of the trench contact structure 626 has a composition different than a composition of the insulating caps 616 of the first 608 and second 610 gate electrodes. In one such embodiment, the insulating cap 628 of the trench contact structure 626 includes a carbide material, such as a silicon carbide material. The insulating caps 616 of the first 608 and second 610 gate electrodes include a nitride material, such as a silicon nitride material.

In an embodiment, the insulating caps 616 of the first 608 and second 610 gate electrodes both have a bottom surface 617A below a bottom surface 628A of the insulating cap 628 of the trench contact structure 626, as is depicted in FIG. 6A. In another embodiment, the insulating caps 616 of the first 608 and second 610 gate electrodes both have a bottom surface 617B substantially co-planar with a bottom surface 628B of the insulating cap 628 of the trench contact structure 626, as is depicted in FIG. 6B. In another embodiment, although not depicted, the insulating caps 616 of the first 608 and second 610 gate electrodes both have a bottom surface above a bottom surface of an insulating cap 628 of a trench contact structure 626.

As described throughout the present application, a substrate may be composed of a semiconductor material that can withstand a manufacturing process and in which charge can migrate. In an embodiment, a substrate is described herein is a bulk substrate composed of a crystalline silicon, silicon/germanium or germanium layer doped with a charge carrier, such as but not limited to phosphorus, arsenic, boron or a combination thereof, to form an active region. In one embodiment, the concentration of silicon atoms in such a bulk substrate is greater than 97%. In another embodiment, a bulk substrate is composed of an epitaxial layer grown atop a distinct crystalline substrate, e.g. a silicon epitaxial layer grown atop a boron-doped bulk silicon mono-crystalline substrate. A bulk substrate may alternatively be composed of a group III-V material. In an embodiment, a bulk substrate is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, a bulk substrate is composed of a III-V material and the charge-carrier dopant impurity atoms are ones such as, but not limited to, beryllium, carbon, silicon, germanium, oxygen, sulfur, selenium or tellurium.

As described throughout the present application, isolation regions such as shallow trench isolation regions or sub-fin isolation regions may be composed of a material suitable to ultimately electrically isolate, or contribute to the isolation of, portions of a permanent gate structure from an underlying bulk substrate or to isolate active regions formed within an underlying bulk substrate, such as isolating fin active regions. For example, in one embodiment, an isolation region is composed of one or more layers of a dielectric material such as, but not limited to, silicon dioxide, silicon oxy-nitride, silicon nitride, carbon-doped silicon nitride, or a combination thereof.

As described throughout the present application, gate lines or gate structures may be composed of a gate electrode stack which includes a gate dielectric layer and a gate electrode layer. In an embodiment, the gate electrode of the gate electrode stack is composed of a metal gate and the gate dielectric layer is composed of a high-K material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of a semiconductor substrate. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride. In some implementations, a portion of the gate dielectric is a "U"-shaped structure that includes a bottom portion substantially parallel to the surface of the substrate and two sidewall portions that are substantially perpendicular to the top surface of the substrate.

In one embodiment, a gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer. The gate electrode layer may consist of a P-type workfunction metal or an N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a conductive fill layer. For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

As described throughout the present application, spacers associated with gate lines or electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

In an embodiment, approaches described herein may involve formation of a contact pattern which is very well aligned to an existing gate pattern while eliminating the use of a lithographic operation with exceedingly tight registration budget. In one such embodiment, this approach enables the use of intrinsically highly selective wet etching (e.g., versus dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in other approaches. In an embodiment, a trench contact grid is not separately patterned, but is rather formed between poly (gate) lines. For example, in one such embodiment, a trench contact grid is formed subsequent to gate grating patterning but prior to gate grating cuts.

Pitch division processing and patterning schemes may be implemented to enable embodiments described herein or may be included as part of embodiments described herein. Pitch division patterning typically refers to pitch halving, pitch quartering etc. Pitch division schemes may be applicable to FEOL processing, BEOL processing, or both FEOL (device) and BEOL (metallization) processing. In accordance with one or more embodiments described herein, optical lithography is first implemented to print unidirectional lines (e.g., either strictly unidirectional or predominantly unidirectional) in a pre-defined pitch. Pitch division processing is then implemented as a technique to increase line density.

In an embodiment, the term "grating structure" for fins, gate lines, metal lines, ILD lines or hardmask lines is used herein to refer to a tight pitch grating structure. In one such embodiment, the tight pitch is not achievable directly through a selected lithography. For example, a pattern based on a selected lithography may first be formed, but the pitch may be halved by the use of spacer mask patterning, as is known in the art. Even further, the original pitch may be quartered by a second round of spacer mask patterning. Accordingly, the grating-like patterns described herein may have metal lines, ILD lines or hardmask lines spaced at a substantially consistent pitch and having a substantially consistent width. For example, in some embodiments the pitch variation would be within ten percent and the width variation would be within ten percent, and in some embodiments, the pitch variation would be within five percent and the width variation would be within five percent. The pattern may be fabricated by a pitch halving or pitch quartering, or other pitch division, approach. In an embodiment, the grating is not necessarily single pitch.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, as is also used throughout the present description, hardmask materials are composed of dielectric materials different from the interlayer dielectric material. In one embodiment, different hardmask materials may be used in different regions so as to provide different growth or etch selectivity to each other and to the underlying dielectric and metal layers. In some embodiments, a hardmask layer includes a layer of a nitride of silicon (e.g., silicon nitride) or a layer of an oxide of silicon, or both, or a combination thereof. Other suitable materials may include carbon-based materials. In another embodiment, a hardmask material includes a metal species. For example, a hardmask or other overlying material may include a layer of a nitride of titanium or another metal (e.g., titanium nitride). Potentially lesser amounts of other materials, such as oxygen, may be included in one or more of these layers. Alternatively, other hardmask layers known in the arts may be used depending upon the particular implementation. The hardmask layers maybe formed by CVD, PVD, or by other deposition methods.

In an embodiment, as is also used throughout the present description, lithographic operations are performed using 193 nm immersion lithography (i193), extreme ultra-violet (EUV) lithography or electron beam direct write (EBDW) lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

It is to be appreciated that not all aspects of the processes described above need be practiced to fall within the spirit and scope of embodiments of the present disclosure. For example, in one embodiment, dummy gates need not ever be formed prior to fabricating gate contacts over active portions of the gate structures. The gate structures described above may actually be permanent gate structures as initially formed. Also, the processes described herein may be used to fabricate one or a plurality of semiconductor devices. The semiconductor devices may be transistors or like devices. For example, in an embodiment, the semiconductor devices are a metal-oxide semiconductor (MOS) transistors for logic or memory, or are bipolar transistors. Also, in an embodiment, the semiconductor devices have a three-dimensional architecture, such as a trigate device, an independently accessed double gate device, or a FIN-FET. One or more embodiments may be particularly useful for fabricating semiconductor devices at a 10 nanometer (10 nm) technology node or a sub-10 nanometer (10 nm) technology node.

Additional or intermediate operations for FEOL layer or structure fabrication may include standard microelectronic fabrication processes such as lithography, etch, thin films deposition, planarization (such as chemical mechanical polishing (CMP)), diffusion, metrology, the use of sacrificial layers, the use of etch stop layers, the use of planarization stop layers, or any other associated action with microelectronic component fabrication. Also, it is to be appreciated that the process operations described for the preceding process flows may be practiced in alternative sequences, not every operation need be performed or additional process operations may be performed, or both.

It is to be appreciated that in the above exemplary FEOL embodiments, in an embodiment, 10 nanometer or sub-10 nanometer node processing is implemented directly in to the fabrication schemes and resulting structures as a technology driver. In other embodiment, FEOL considerations may be driven by BEOL 10 nanometer or sub-10 nanometer processing requirements. For example, material selection and layouts for FEOL layers and devices may need to accommodate BEOL processing. In one such embodiment, material selection and gate structure architectures are selected to accommodate high density metallization of the BEOL layers, e.g., to reduce fringe capacitance in transistor structures formed in the FEOL layers but coupled together by high density metallization of the BEOL layers.

Embodiments disclosed herein may be used to manufacture a wide variety of different types of integrated circuits or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 7:
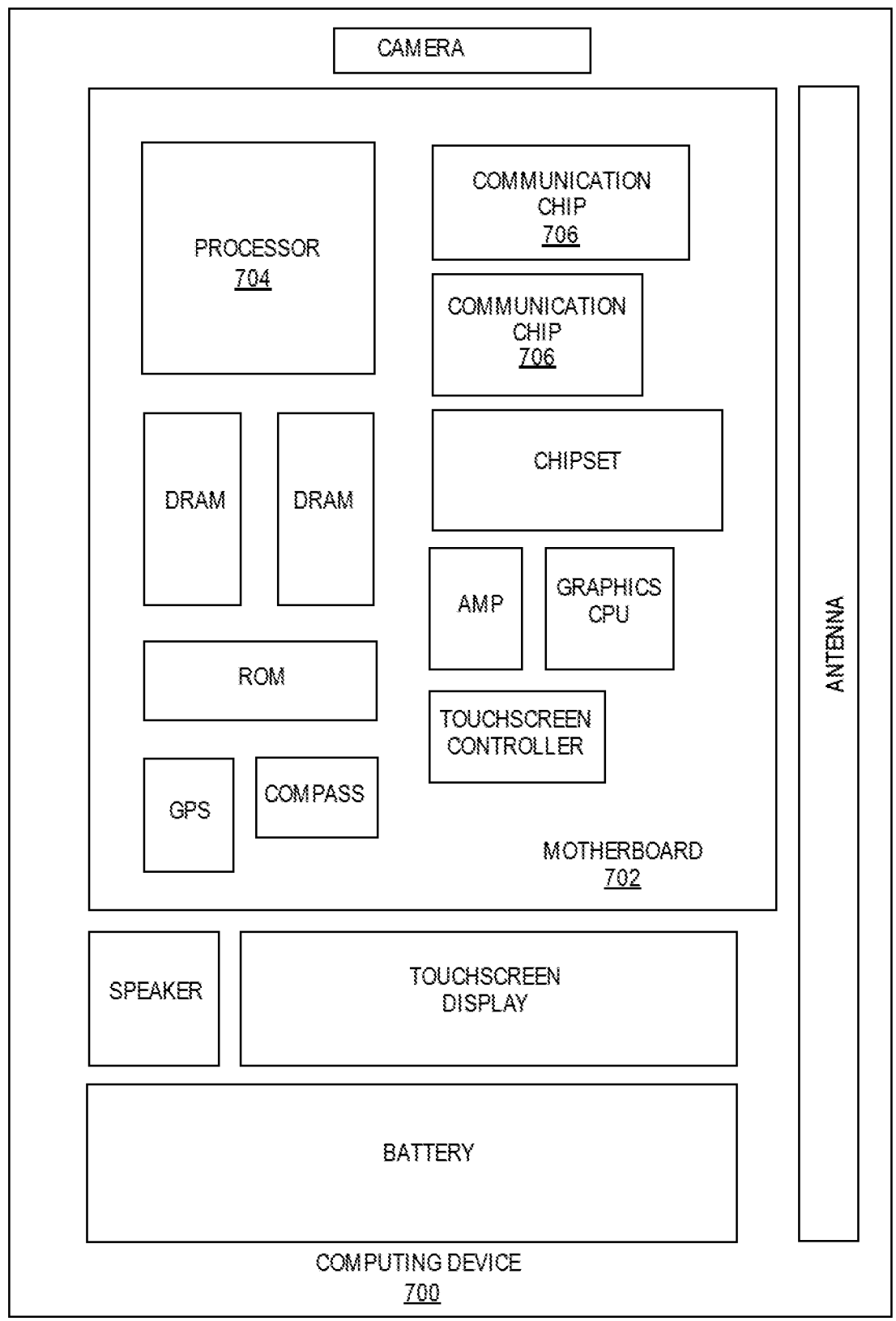
FIG. 7 illustrates a computing device in accordance with one implementation of the disclosure.

FIG. 7 illustrates a computing device 700 in accordance with one implementation of the disclosure. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations of embodiments of the disclosure, the integrated circuit die of the processor includes one or more structures, such as integrated circuit structures built in accordance with implementations of the disclosure. The term "processor" may refer to any device or portion of a device that processes electronic data from registers or memory to transform that electronic data, or both, into other electronic data that may be stored in registers or memory, or both.

The communication chip 706 also includes an integrated circuit die packaged within the communication chip 706. In accordance with another implementation of the disclosure, the integrated circuit die of the communication chip is built in accordance with implementations of the disclosure.

In further implementations, another component housed within the computing device 700 may contain an integrated circuit die built in accordance with implementations of embodiments of the disclosure.

In various embodiments, the computing device 700 may be a laptop, a netbook, a notebook, an ultrabook, a smartphone, a tablet, a personal digital assistant (PDA), an ultramobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Figure 8:
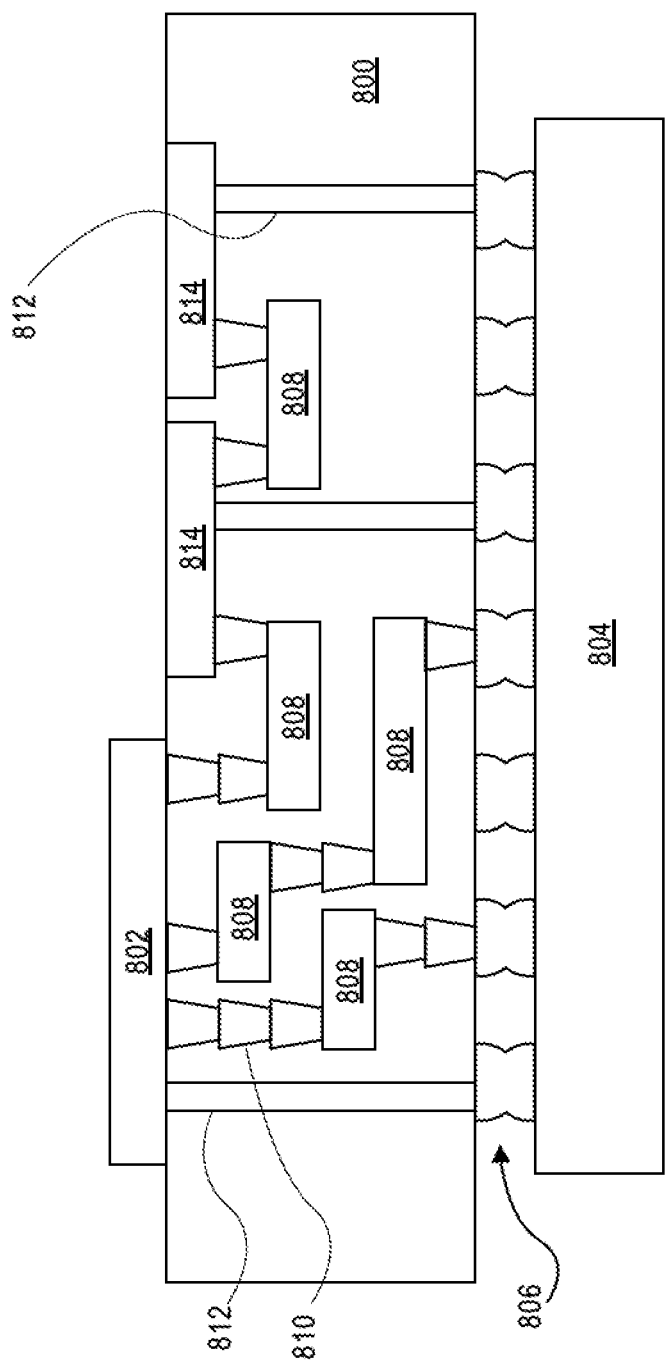
FIG. 8 illustrates an interposer that includes one or more embodiments of the disclosure.

FIG. 8 illustrates an interposer 800 that includes one or more embodiments of the disclosure. The interposer 800 is an intervening substrate used to bridge a first substrate 802 to a second substrate 804. The first substrate 802 may be, for instance, an integrated circuit die. The second substrate 804 may be, for instance, a memory module, a computer motherboard, or another integrated circuit die. Generally, the purpose of an interposer 800 is to spread a connection to a wider pitch or to reroute a connection to a different connection. For example, an interposer 800 may couple an integrated circuit die to a ball grid array (BGA) 806 that can subsequently be coupled to the second substrate 804. In some embodiments, the first and second substrates 802/804 are attached to opposing sides of the interposer 800. In other embodiments, the first and second substrates 802/804 are attached to the same side of the interposer 800. And in further embodiments, three or more substrates are interconnected by way of the interposer 800.

The interposer 800 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 808 and vias 810, including but not limited to through-silicon vias (TSVs) 812. The interposer 800 may further include embedded devices 814, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 800. In accordance with embodiments of the disclosure, apparatuses or processes disclosed herein may be used in the fabrication of interposer 800 or in the fabrication of components included in the interposer 800.

Figure 9:
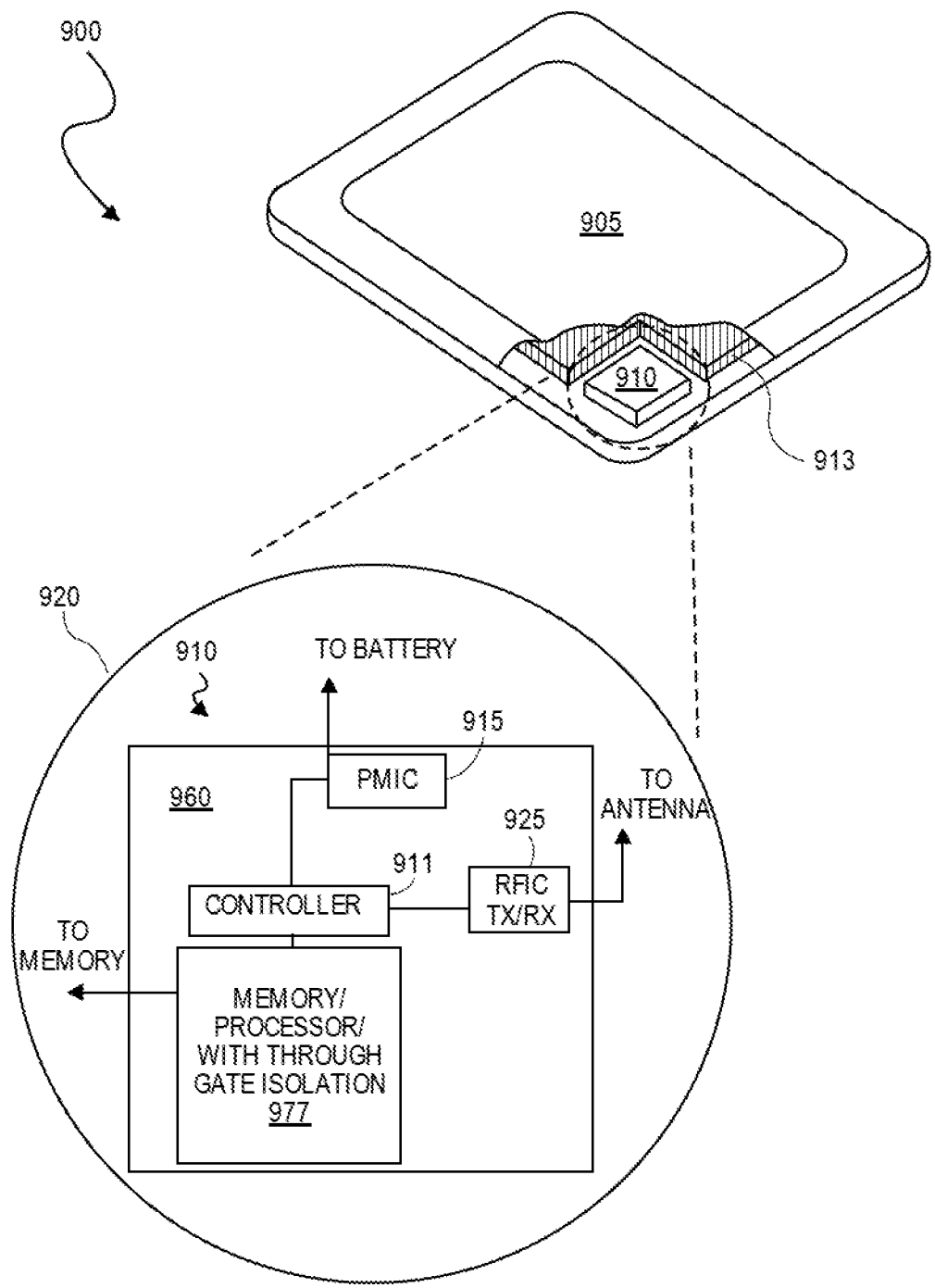
FIG. 9 is an isometric view of a mobile computing platform employing an IC fabricated according to one or more processes described herein or including one or more features described herein, in accordance with an embodiment of the present disclosure.

FIG. 9 is an isometric view of a mobile computing platform 900 employing an integrated circuit (IC) fabricated according to one or more processes described herein or including one or more features described herein, in accordance with an embodiment of the present disclosure.

The mobile computing platform 900 may be any portable device configured for each of electronic data display, electronic data processing, and wireless electronic data transmission. For example, mobile computing platform 900 may be any of a tablet, a smart phone, laptop computer, etc. and includes a display screen 905 which in the exemplary embodiment is a touchscreen (capacitive, inductive, resistive, etc.), a chip-level (SoC) or package-level integrated system 910, and a battery 913. As illustrated, the greater the level of integration in the system 910 enabled by higher transistor packing density, the greater the portion of the mobile computing platform 900 that may be occupied by the battery 913 or non-volatile storage, such as a solid state drive, or the greater the transistor gate count for improved platform functionality. Similarly, the greater the carrier mobility of each transistor in the integrated system 910, the greater the functionality. As such, techniques described herein may enable performance and form factor improvements in the mobile computing platform 900.

The integrated system 910 is further illustrated in the expanded view 920. In the exemplary embodiment, packaged device 977 includes at least one memory chip (e.g., RAM), or at least one processor chip (e.g., a multi-core microprocessor and/or graphics processor) fabricated according to one or more processes described herein or including one or more features described herein. The packaged device 977 is further coupled to the board 960 along with one or more of a power management integrated circuit (PMIC) 915, RF (wireless) integrated circuit (RFIC) 925 including a wideband RF (wireless) transmitter and/or receiver (e.g., including a digital baseband and an analog front end module further includes a power amplifier on a transmit path and a low noise amplifier on a receive path), and a controller thereof 911. Functionally, the PMIC 915 performs battery power regulation, DC-to-DC conversion, etc., and so has an input coupled to the battery 913 and with an output providing a current supply to all the other functional modules. As further illustrated, in the exemplary embodiment, the RFIC 925 has an output coupled to an antenna to provide to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the packaged device 977 or within a single IC (SoC) coupled to the package substrate of the packaged device 977.

In another aspect, semiconductor packages are used for protecting an integrated circuit (IC) chip or die, and also to provide the die with an electrical interface to external circuitry. With the increasing demand for smaller electronic devices, semiconductor packages are designed to be even more compact and must support larger circuit density. Furthermore, the demand for higher performance devices results in a need for an improved semiconductor package that enables a thin packaging profile and low overall warpage compatible with subsequent assembly processing.

In an embodiment, wire bonding to a ceramic or organic package substrate is used. In another embodiment, a C4 process is used to mount a die to a ceramic or organic package substrate. In particular, C4 solder ball connections can be implemented to provide flip chip interconnections between semiconductor devices and substrates. A flip chip or Controlled Collapse Chip Connection (C4) is a type of mounting used for semiconductor devices, such as integrated circuit (IC) chips, MEMS or components, which utilizes solder bumps instead of wire bonds. The solder bumps are deposited on the C4 pads, located on the top side of the substrate package. In order to mount the semiconductor device to the substrate, it is flipped over with the active side facing down on the mounting area. The solder bumps are used to connect the semiconductor device directly to the substrate.

Figure 10:
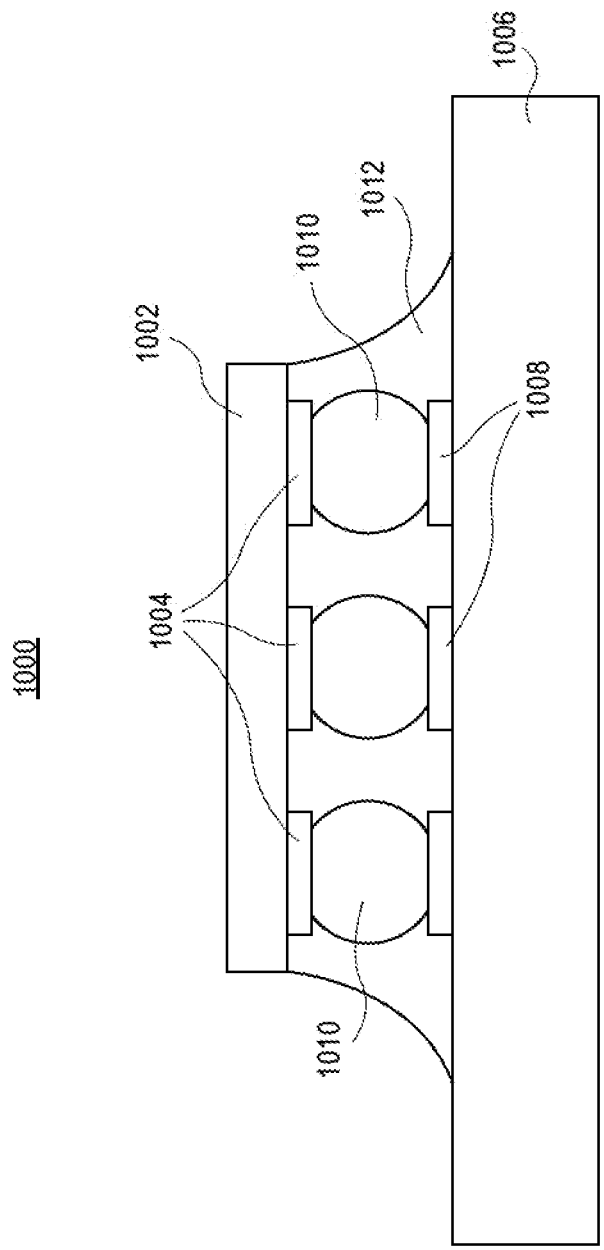
FIG. 10 illustrates a cross-sectional view of a flip-chip mounted die, in accordance with an embodiment of the present disclosure.

FIG. 10 illustrates a cross-sectional view of a flip-chip mounted die, in accordance with an embodiment of the present disclosure.

Referring to FIG. 10, an apparatus 1000 includes a die 1002 such as an integrated circuit (IC) fabricated according to one or more processes described herein or including one or more features described herein, in accordance with an embodiment of the present disclosure. The die 1002 includes metallized pads 1004 thereon. A package substrate 1006, such as a ceramic or organic substrate, includes connections 1008 thereon. The die 1002 and package substrate 1006 are electrically connected by solder balls 1010 coupled to the metallized pads 1004 and the connections 1008. An underfill material 1012 surrounds the solder balls 1010.

Processing a flip chip may be similar to conventional IC fabrication, with a few additional operations. Near the end of the manufacturing process, the attachment pads are metalized to make them more receptive to solder. This typically consists of several treatments. A small dot of solder is then deposited on each metalized pad. The chips are then cut out of the wafer as normal. To attach the flip chip into a circuit, the chip is inverted to bring the solder dots down onto connectors on the underlying electronics or circuit board. The solder is then re-melted to produce an electrical connection, typically using an ultrasonic or alternatively reflow solder process. This also leaves a small space between the chip's circuitry and the underlying mounting. In most cases an electrically-insulating adhesive is then "underfilled" to provide a stronger mechanical connection, provide a heat bridge, and to ensure the solder joints are not stressed due to differential heating of the chip and the rest of the system.

In other embodiments, newer packaging and die-to-die interconnect approaches, such as through silicon via (TSV) and silicon interposer, are implemented to fabricate high performance Multi-Chip Module (MCM) and System in Package (SiP) incorporating an integrated circuit (IC) fabricated according to one or more processes described herein or including one or more features described herein, in accordance with an embodiment of the present disclosure.

Thus, embodiments of the present disclosure include integrated circuit structures having source or drain dopant diffusion blocking layers.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments may be variously combined with some features included and others excluded to suit a variety of different applications.

Example Embodiment 1

An integrated circuit structure includes a fin including silicon. A gate structure is over a channel region of the fin, the gate structure having a first side opposite a second side. A first source or drain structure is at the first side of the gate structure. A second source or drain structure is at the second side of the gate structure. The first and second source or drain structures include a first semiconductor layer and a second semiconductor layer. The first semiconductor layer is in contact with the channel region of the fin, and the second semiconductor layer is on the first semiconductor layer. The first semiconductor layer has a greater concentration of germanium than the second semiconductor layer, and the second semiconductor layer includes boron dopant impurity atoms.

Example Embodiment 2

The integrated circuit structure of example embodiment 1, wherein the first semiconductor layer includes silicon germanium, and the second semiconductor layer includes silicon germanium.

Example Embodiment 3

The integrated circuit structure of example embodiment 1, wherein the first semiconductor layer consists essentially of germanium, and the second semiconductor layer includes silicon germanium.

Example Embodiment 4

The integrated circuit structure of example embodiment 1, 2 or 3, wherein the fin further includes germanium, and wherein the first semiconductor layer has a greater concentration of germanium than the fin.

Example Embodiment 5

The integrated circuit structure of example embodiment 4, wherein the fin includes silicon germanium, the first semiconductor layer includes silicon germanium, and the second semiconductor layer includes silicon germanium.

Example Embodiment 6

The integrated circuit structure of example embodiment 4, wherein the fin includes silicon germanium, the first semiconductor layer consists essentially of germanium, and the second semiconductor layer includes silicon germanium.

Example Embodiment 7

The integrated circuit structure of example embodiment 1, 2, 3, 4, 5 or 6, wherein the fin includes a sub-fin structure including an upper silicon germanium layer and a lower silicon layer.

Example Embodiment 8

The integrated circuit structure of example embodiment 7, wherein the lower silicon layer of the sub-fin structure is continuous with a bulk silicon substrate.

Example Embodiment 9

The integrated circuit structure of example embodiment 1, 2, 3, 4, 5, 6, 7 or 8, wherein the first and second source or drain structures are first and second epitaxial source or drain structures embedded in the fin at the first and second sides of the gate structures, respectively.

Example Embodiment 10

The integrated circuit structure of example embodiment 1, 2, 3, 4, 5, 6, 7, 8 or 9, wherein the gate structure is adjacent a gate endcap structure.

Example Embodiment 11

An integrated circuit structure includes a fin including silicon. A P-type gate structure is over a channel region of the fin, the gate structure having a first side opposite a second side. A first P-type source or drain structure is at the first side of the P-type gate structure. A second P-type source or drain structure is at the second side of the P-type gate structure. The first and second P-type source or drain structures include a dopant diffusion blocking layer in contact with the channel region of the fin, and a boron-doped semiconductor layer on the dopant diffusion blocking layer.

Example Embodiment 12

The integrated circuit structure of example embodiment 11, wherein the dopant diffusion blocking layer includes silicon germanium, and the boron-doped semiconductor layer includes boron-doped silicon germanium.

Example Embodiment 13

The integrated circuit structure of example embodiment 11, wherein the dopant diffusion blocking layer consists essentially of germanium, and the boron-doped semiconductor layer includes boron-doped silicon germanium.

Example Embodiment 14

The integrated circuit structure of example embodiment 11, 12 or 13, wherein the fin further includes germanium, and wherein the dopant diffusion blocking layer has a greater concentration of germanium than the fin.

Example Embodiment 15

The integrated circuit structure of example embodiment 14, wherein the fin includes silicon germanium, the dopant diffusion blocking layer includes silicon germanium, and the boron-doped semiconductor layer includes boron-doped silicon germanium.

Example Embodiment 16

The integrated circuit structure of example embodiment 14, wherein the fin includes silicon germanium, the dopant diffusion blocking layer consists essentially of germanium, and the boron-doped semiconductor layer includes boron-doped silicon germanium.

Example Embodiment 17

The integrated circuit structure of example embodiment 11, 12, 13, 14, 15 or 16, wherein the fin includes a sub-fin structure includes an upper silicon germanium layer and a lower silicon layer.

Example Embodiment 18

The integrated circuit structure of example embodiment 17, wherein the lower silicon layer of the sub-fin structure is continuous with a bulk silicon substrate.

Example Embodiment 19

The integrated circuit structure of example embodiment 11, 12, 13, 14, 15, 16, 17 or 18, wherein the first and second source or drain structures are first and second epitaxial source or drain structures embedded in the fin at the first and second sides of the gate structure, respectively.

Example Embodiment 20

The integrated circuit structure of example embodiment 11, 12, 13, 14, 15, 16, 17, 18 or 19, wherein the gate structure is adjacent a gate endcap structure.

Example Embodiment 21

A method of fabricating an integrated circuit structure includes forming a fin including silicon. The method also includes forming a gate structure over a channel region of the fin, the gate structure having a first side opposite a second side. The method also includes etching portions of the fin at the first and second sides of the gate structure. The method also includes forming first and second source or drain structures in the etched regions of the fin at the first and second sides of the gate structure, respectively. The first and second source or drain structures include a first semiconductor layer in contact with the channel region of the fin, and a second semiconductor layer on the first semiconductor layer. The first semiconductor layer includes a greater concentration of germanium than the second semiconductor layer, and the second semiconductor layer includes boron dopant impurity atoms.

Example Embodiment 22

The method of example embodiment 21, wherein forming the first and second source or drain structures includes epitaxially depositing the first and second semiconductor layers.

Example Embodiment 23

The method of example embodiment 21, wherein forming the first and second source or drain structures includes forming a silicon germanium material in the etched regions of the fin at the first and second sides of the gate structure and then condensing germanium from the silicon germanium material to a location in contact with the channel region.

Example Embodiment 24

The method of example embodiment 21, wherein the fin further includes germanium, and wherein forming the first and second source or drain structures includes removing silicon from outer portions of the channel region and then forming a silicon germanium material in the etched regions of the fin at the first and second sides of the gate structure.

What is claimed is:
1. An integrated circuit structure, comprising:
a fin comprising silicon;
a gate structure over a channel region of the fin, the gate structure having a first side opposite a second side;
a first source or drain structure at the first side of the gate structure; and
a second source or drain structure at the second side of the gate structure, the first and second source or drain structures comprising a first semiconductor layer and a second semiconductor layer, the first semiconductor layer in contact with the channel region of the fin, and the second semiconductor layer on the first semiconductor layer, wherein the first semiconductor layer comprises a greater concentration of germanium than the second semiconductor layer, wherein the second semiconductor layer comprises boron dopant impurity atoms, and wherein the first semiconductor layer laterally surrounds the second semiconductor layer and is along a bottom of the second semiconductor layer.

2. The integrated circuit structure of claim 1, wherein the first semiconductor layer comprises silicon germanium, and the second semiconductor layer comprises silicon germanium.

3. The integrated circuit structure of claim 1, wherein the first semiconductor layer consists essentially of germanium, and the second semiconductor layer comprises silicon germanium.

4. The integrated circuit structure of claim 1, wherein the fin further comprises germanium, and wherein the first semiconductor layer comprises a greater concentration of germanium than the fin.

5. The integrated circuit structure of claim 4, wherein the fin comprises silicon germanium, the first semiconductor layer comprises silicon germanium, and the second semiconductor layer comprises silicon germanium.

6. The integrated circuit structure of claim 4, wherein the fin comprises silicon germanium, the first semiconductor layer consists essentially of germanium, and the second semiconductor layer comprises silicon germanium.

7. The integrated circuit structure of claim 4, wherein the fin includes a sub-fin structure comprising an upper silicon germanium layer and a lower silicon layer.

8. The integrated circuit structure of claim 7, wherein the lower silicon layer of the sub-fin structure is continuous with a bulk silicon substrate.

9. The integrated circuit structure of claim 1, wherein the first and second source or drain structures are first and second epitaxial source or drain structures embedded in the fin at the first and second sides of the gate structure, respectively.

10. The integrated circuit structure of claim 1, wherein the gate structure is adjacent a gate endcap structure.

11. An integrated circuit structure, comprising:
a fin comprising silicon;
a P-type gate structure over a channel region of the fin, the gate structure having a first side opposite a second side;
a first P-type source or drain structure at the first side of the P-type gate structure; and
a second P-type source or drain structure at the second side of the P-type gate structure, the first and second P-type source or drain structures comprising a dopant diffusion blocking layer in contact with the channel region of the fin, and the first and second P-type source or drain structures comprising a boron-doped semiconductor layer on the dopant diffusion blocking layer wherein the dopant diffusion blocking layer laterally surrounds the boron-doped semiconductor layer and is along a bottom of the boron-doped semiconductor layer.

12. The integrated circuit structure of claim 11, wherein the dopant diffusion blocking layer comprises silicon germanium, and the boron-doped semiconductor layer comprises boron-doped silicon germanium.

13. The integrated circuit structure of claim 11, wherein the dopant diffusion blocking layer consists essentially of germanium, and the boron-doped semiconductor layer comprises boron-doped silicon germanium.

14. The integrated circuit structure of claim 11, wherein the fin further comprises germanium, and wherein the dopant diffusion blocking layer comprises a greater concentration of germanium than the fin.

15. The integrated circuit structure of claim 14, wherein the fin comprises silicon germanium, the dopant diffusion blocking layer comprises silicon germanium, and the boron-doped semiconductor layer comprises boron-doped silicon germanium.

16. The integrated circuit structure of claim 14, wherein the fin comprises silicon germanium, the dopant diffusion blocking layer consists essentially of germanium, and the boron-doped semiconductor layer comprises boron-doped silicon germanium.

17. The integrated circuit structure of claim 14, wherein the fin includes a sub-fin structure comprising an upper silicon germanium layer and a lower silicon layer.

18. The integrated circuit structure of claim 17, wherein the lower silicon layer of the sub-fin structure is continuous with a bulk silicon substrate.

19. The integrated circuit structure of claim 11, wherein the first and second source or drain structures are first and second epitaxial source or drain structures embedded in the fin at the first and second sides of the gate structure, respectively.

20. The integrated circuit structure of claim 11, wherein the gate structure is adjacent a gate endcap structure.

* * * * *